United States Patent
Murata et al.

(10) Patent No.: US 10,964,711 B2
(45) Date of Patent: Mar. 30, 2021

(54) SEMICONDUCTOR MEMORY DEVICE

(71) Applicant: TOSHIBA MEMORY CORPORATION, Tokyo (JP)

(72) Inventors: Takeshi Murata, Yokkaichi Mie (JP); Yoshinori Nakakubo, Yokkaichi Mie (JP); Hiroaki Hayasaka, Yokkaichi Mie (JP); Naoki Yamamoto, Kuwana Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/115,513

(22) Filed: Aug. 28, 2018

(65) Prior Publication Data

US 2019/0296031 A1    Sep. 26, 2019

(30) Foreign Application Priority Data

Mar. 22, 2018  (JP) .................................. 2018-054666

(51) Int. Cl.
  *H01L 27/11529*    (2017.01)
  *H01L 27/11551*    (2017.01)

(52) U.S. Cl.
  CPC .. *H01L 27/11529* (2013.01); *H01L 27/11551* (2013.01)

(58) Field of Classification Search
  CPC ................ H01L 27/11529; H01L 27/11551
  USPC ........................................................ 257/324
  See application file for complete search history.

(56) References Cited

U.S. PATENT DOCUMENTS

| | | | |
|---|---|---|---|
| 8,658,499 B2 * | 2/2014 | Makala | H01L 27/11556 438/264 |
| 9,431,419 B2 | 8/2016 | Fukuzumi et al. | |
| 9,721,663 B1 * | 8/2017 | Ogawa | G11C 16/0483 |
| 10,516,025 B1 * | 12/2019 | Nishikawa | H01L 29/42336 |
| 2012/0001247 A1 * | 1/2012 | Alsmeier | H01L 27/11551 257/316 |
| 2015/0255481 A1 * | 9/2015 | Baenninger | H01L 27/11582 438/268 |
| 2016/0181272 A1 * | 6/2016 | Rabkin | H01L 21/02653 438/268 |
| 2016/0260725 A1 * | 9/2016 | Jung | H01L 27/11565 |
| 2018/0122906 A1 * | 3/2018 | Yu et al. | H01L 29/1037 |
| 2018/0152657 A1 * | 5/2018 | Miyazawa | H04N 5/341 |
| 2018/0366487 A1 * | 12/2018 | Okizumi | H01L 27/11565 |

(Continued)

*Primary Examiner* — Igwe U Anya
(74) *Attorney, Agent, or Firm* — Kim & Stewart LLP

(57) ABSTRACT

A semiconductor memory device includes a first insulating layer over a semiconductor substrate, a metal layer, an adhesive layer on a first region of the metal layer, a conductive layer on a second region of the metal layer and on the adhesive layer, a second insulating layer on the conductive layer, a plurality of wiring layers that are separated from each other and are stacked above the second insulating layer, a semiconductor layer that extends in a first direction perpendicular to the semiconductor substrate and includes a bottom surface connected to the conductive layer, a storage portion disposed between at least one of the plurality of wiring layers and the semiconductor layer, and a slit that extends in the first direction, includes aside surface in contact with the plurality of wiring layers and a bottom surface reaching the conductive layer, and is filled with an insulating material.

8 Claims, 23 Drawing Sheets

(56) References Cited

U.S. PATENT DOCUMENTS

2019/0057974 A1* 2/2019 Lu .................... H01L 27/11565
2019/0312050 A1* 10/2019 Lai .................... H01L 29/66833

* cited by examiner

SEMICONDUCTOR MEMORY DEVICE

CROSS-REFERENCE TO RELATED APPLICATIONS

This application is based upon and claims the benefit of priority from Japanese Patent Application No. 2018-054666, filed Mar. 22, 2018, the entire contents of which are incorporated herein by reference.

FIELD

Embodiments described herein relate generally to a semiconductor memory device.

BACKGROUND

As a semiconductor memory device, a NAND flash memory is known.

DETAILED DESCRIPTION

Figure 1:
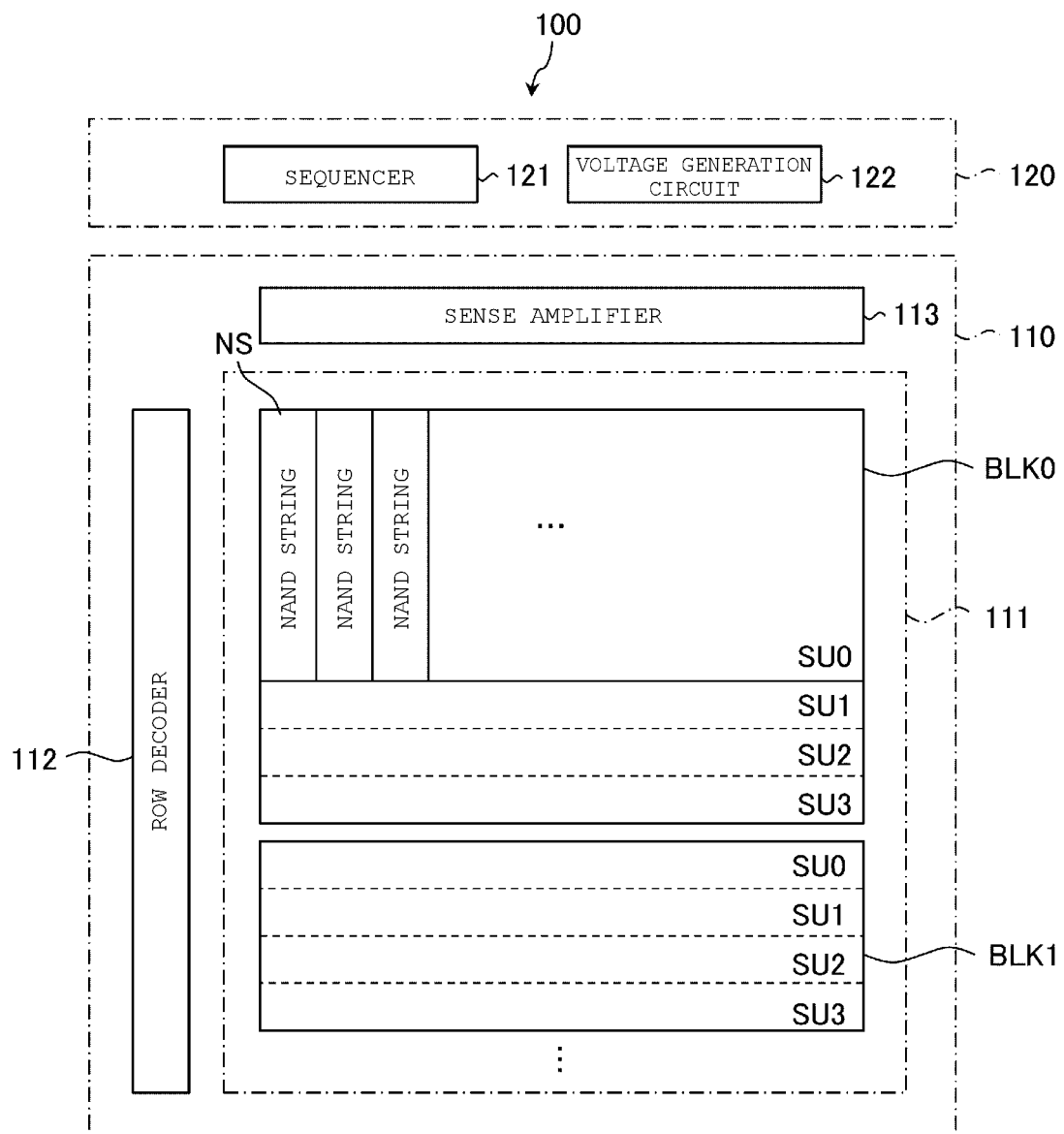
FIG. 1 is a block diagram of a semiconductor memory device according to a first embodiment.

Embodiments provide a semiconductor memory device capable of improved reliability.

In general, according to one embodiment, a semiconductor memory device includes a semiconductor substrate, a first insulating layer over the semiconductor substrate, a metal layer on the first insulating layer, an adhesive layer on a first region of the metal layer, a conductive layer on a second region of the metal layer and on the adhesive layer, a second insulating layer formed on the conductive layer, a plurality of wiring layers that are separated from each other and are stacked above the second insulating layer, a semiconductor layer that extends in a first direction perpendicular to the semiconductor substrate and includes a bottom surface connected to the conductive layer, a storage portion disposed between at least one of the plurality of wiring layers and the semiconductor layer, and a slit that extends in the first direction, includes a side surface in contact with the plurality of wiring layers and a bottom surface reaching the conductive layer, and is filled with an insulating material.

Hereinafter, embodiments will be described with reference to the drawings. In the following description, components having substantially the same function and configuration are denoted by the same reference numerals, and redundant explanations are given only when necessary. In addition, each of the following embodiments exemplifies an apparatus or a method for embodying a technical idea of the embodiment. In the technical idea of the embodiment, a material, a shape, a structure, an arrangement, or the like of the component is not limited to these mentioned below. The technical idea of the embodiment may be modified variously within the scope of the claims.

1. First Embodiment

A semiconductor memory device according to a first embodiment will be described. In the following description, as an example of a semiconductor memory device, a three-dimensionally-stacked NAND flash memory in which memory cell transistors are three-dimensionally stacked on a semiconductor substrate will be described.

1.1 Configuration
1.1.1 Overall Configuration of Semiconductor Memory Device First, an overall configuration of a semiconductor memory device will be described with reference to FIG. 1. FIG. 1 is a block diagram illustrating an overall configuration of a NAND flash memory 100.

As illustrated in FIG. 1, a NAND flash memory 100 includes a memory core unit 110 and a peripheral circuit 120.

The memory core unit 110 includes a memory cell array 111, a row decoder 112, and a sense amplifier 113.

The memory cell array 111 includes a plurality of blocks BLK (BLK0, BLK1, . . . ) which are sets of a plurality of nonvolatile memory cell transistors. Data in the same block BLK is erased, for example, at once.

Each of the blocks BLK includes, for example, four string units SU (SU0, SU1, SU2, and SU3). Each string unit SU includes a plurality of NAND strings NS. In the NAND string NS, a plurality of memory cell transistors are connected in series. In the memory cell array 111, the number of the blocks BLK, the number of the string units SU, and the number of the NAND strings NS are randomly set.

In a write operation, a read operation, and an erasing operation, the row decoder 112 decodes addresses of the blocks BLK and addresses of the string units SU, and selects a target word line.

In a read operation, the sense amplifier 113 senses data which is read from the memory cell transistor to a bit line. In a write operation, write data is transmitted to the memory cell transistor.

The peripheral circuit 120 includes a sequencer 121 and a voltage generation circuit 122.

The sequencer 121 controls operations of the entire NAND flash memory 100. More specifically, the sequencer 121 controls the voltage generation circuit 122, the row decoder 112, the sense amplifier 113, and the like during a write operation, a read operation, and an erasing operation.

The voltage generation circuit 122 generates a voltage required for a write operation, a read operation, and an erasing operation, and supplies the voltage to the row decoder 112, the sense amplifier 113, and the like.

1.1.2 Configuration of Memory Cell Array

Next, a configuration of the memory cell array 111 will be described with reference to FIG. 2. In an example of FIG. 2, although the block BLK0 is illustrated, configurations of the other blocks BLK are the same.

Figure 2:
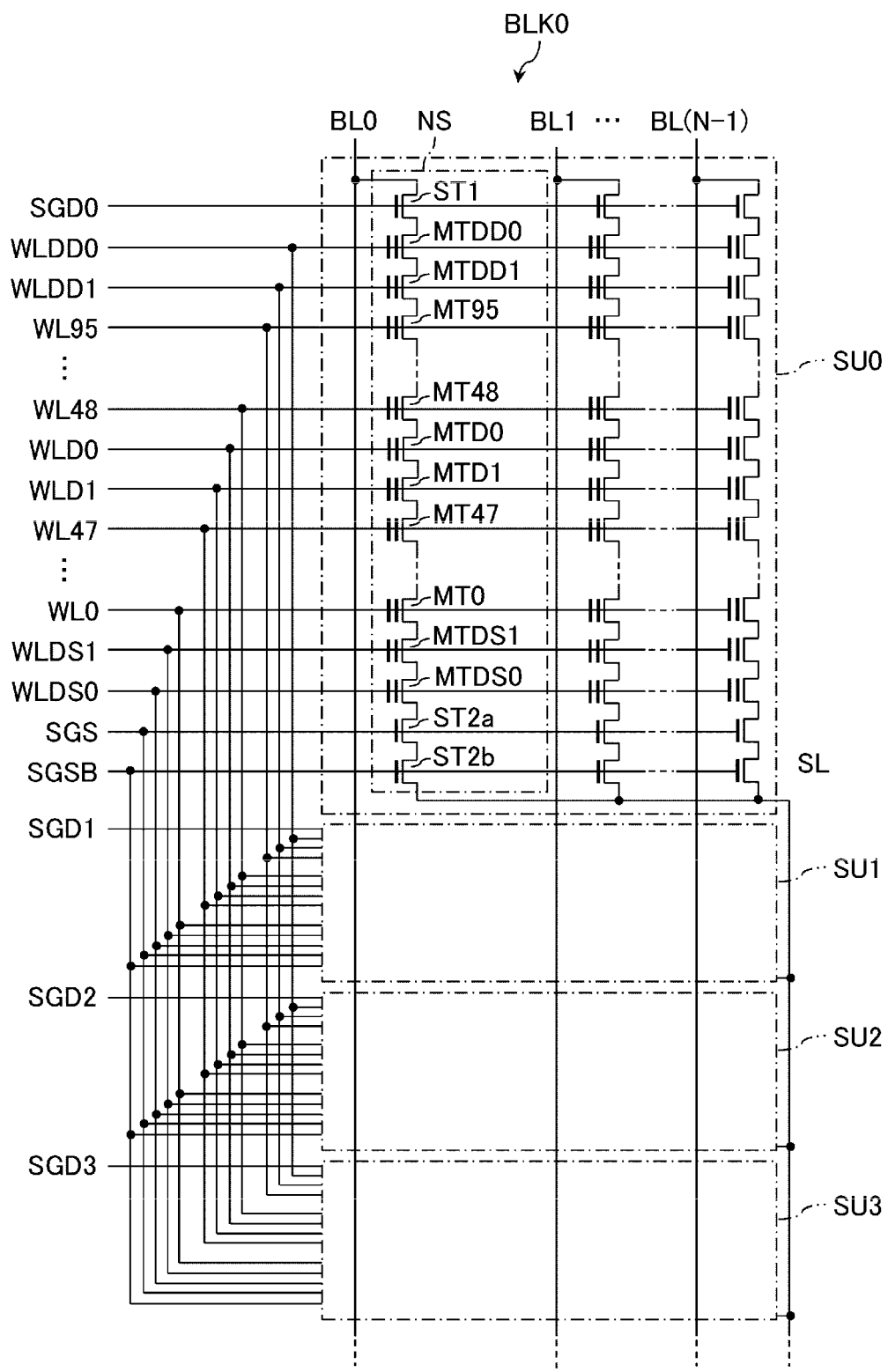
FIG. 2 is a circuit diagram of a memory cell array in the semiconductor memory device according to the first embodiment.

As illustrated in FIG. 2, the block BLK0 includes, for example, four string units SU (SU0 to SU3). Each string unit SU includes a plurality of NAND strings NS. Each of the NAND strings NS includes, for example, 96 memory cell transistors MT0 to MT95, 6 dummy memory cell transistors MTDD0, MTDD1, MTD0, MTD1, MTDS0, and MTDS1, a select transistor ST1, and two select transistors ST2 (ST2a and ST2b). Hereinafter, the memory cell transistors MT0 to MT95 are referred to as memory cell transistors MT in a case where the memory cell transistors are not specified. In addition, the dummy memory cell transistors MTDD0, MTDD1, MTD0, MTD1, MTDS0, and MTDS1 are referred to as dummy memory cell transistors MTD in a case where the dummy memory cell transistors are not specified.

Each of the memory cell transistor MT and the dummy memory cell transistor MTD includes a control gate and a charge storage layer. The memory cell transistor MT holds data in a nonvolatile manner. Although the dummy memory cell transistor MTD has the same configuration as the memory cell transistor MT, the dummy memory cell transistor is used as a dummy and is not used for holding data.

Each of the memory cell transistor MT and the dummy memory cell transistor MTD may be a MONOS type memory cell transistor using an insulating film as a charge storage layer, or an FG type memory cell transistor using a conductive layer as a charge storage layer. Hereinafter, in the present embodiment, an example in which each of the memory cell transistor MT and the dummy memory cell transistor MTD is a MONOS type memory cell transistor will be described. In addition, the number of the memory cell transistors MT may be 8, 16, 32, 64, 128, or the like, and is not limited to these. In addition, the number of the dummy memory cell transistors MTD and the number of the select transistors ST1 and ST2 are randomly set. The number of the select transistors ST1 and ST2 may be one or more.

The memory cell transistors MT and the dummy memory cell transistors MTD are connected in series between a source of the select transistor ST1 and a drain of the select transistor ST2a. More specifically, current paths of the dummy memory cell transistors MTDS0 and MTDS1, the memory cell transistors MT0 to MT47, the dummy memory cell transistors MTD1 and MTD0, the memory cell transistors MT48 to MT95, and the dummy memory cell transistors MTDD1 and MTDD0 are connected in series. A drain of the dummy memory cell transistor MTDD0 is connected to the source of the select transistor ST1, and a source of the dummy memory cell transistor MTDS0 is connected to the drain of the select transistor ST2a. A source of the select transistor ST2a is connected to a drain of the select transistor ST2b.

In the string units SU0 to SU3, each of gates of the select transistors ST1 is connected to each of select gate lines SGD0 to SGD3. In the string units SU0 to SU3, each of gates of the select transistors ST2a is commonly connected to a select gate line SGS, and each of gates of the select transistors ST2b is commonly connected to a select gate line SGSB. Hereinafter, the select gate lines SGD0 to SGD3 are referred to as select gate lines SGD in a case where the select gate lines are not specified. In the string units SU0 to SU3, each of gates of the select transistors ST2a may be connected to each of select gate lines SGS0 to SGS3 which are different from each other, and each of gates of the select transistors ST2b may be connected to each of select gate lines SGSB0 to SGSB3 which are different from each other.

In the blocks BLK, each of the control gates of the memory cell transistors MT0 to MT95 is commonly connected to each of word lines WL0 to WL95. In the blocks BLK, each of the control gates of the dummy memory cell transistors MTDD0a and MTDD0b is commonly connected to a dummy word line WLDD0. In the blocks BLK, each of the control gates of the dummy memory cell transistors MTDD0, MTDD1, MTD0, MTD1, MTDS0, and MTDS1 is commonly connected to each of dummy word lines WLDD0, WLDD1, WLD0, WLD1, WLDS0, and WLDS1. Hereinafter, the word lines WL0 to WL95 are referred to as word lines WL in a case where the word lines are not specified. The dummy word lines WLDD0, WLDD1, WLD0, WLD1, WLDS0, and WLDS1 are referred to as dummy word lines WLD in a case where the dummy word lines are not specified.

In the NAND strings NS of the string units SU, each of drains of the select transistors ST1 is connected to each of bit lines BL0 to BL(N−1) (N is an integer of two or more) which are different from each other. Hereinafter, the bit lines BL0 to BL(N−1) are referred to as bit lines BL in a case where the bit lines are not specified. Each bit line BL is commonly connected to one NAND string NS in each string unit SU of the plurality of blocks BLK. Further, sources of a plurality of select transistors ST2b are commonly connected to a source line SL. That is, the string unit SU is an assembly of the NAND strings NS that are connected to the different bit lines BL and are connected to the same select gate line SGD. In addition, the block BLK is an assembly of the plurality of string units SU that are connected to the common word lines WL. The memory cell array 111 is an assembly of the plurality of blocks BLK that are connected to the common bit lines BL.

A data write operation and a data read operation are collectively performed for the memory cell transistors MT that are connected to any one of the word lines WL in any one of the string units SU.

The memory cell array 111 may have another configuration. That is, a configuration of the memory cell array 111 is described in, for example, U.S. patent application Ser. No. 12/407,403, entitled "THREE DIMENSIONAL STACKED NONVOLATILE SEMICONDUCTOR MEMORY" filed on Mar. 19, 2009. In addition, a configuration of the memory cell array 111 is described in, U.S. patent application Ser. No. 12/406,524, entitled "THREE DIMENSIONAL STACKED NONVOLATILE SEMICONDUCTOR MEMORY" filed on Mar. 18, 2009, U.S. patent application Ser. No. 12/679,991, entitled "NON-VOLATILE SEMICONDUCTOR STORAGE DEVICE AND METHOD OF MANUFACTURING THE SAME" filed on Mar. 25, 2010, and U.S. patent application Ser. No. 12/532,030, entitled "SEMICONDUCTOR MEMORY AND METHOD FOR MANUFACTURING SAME" filed on Mar. 23, 2009. The entire contents of these patent applications are incorporated herein by reference.

1.1.3 Planar Configuration of Memory Cell Array

Figure 3:
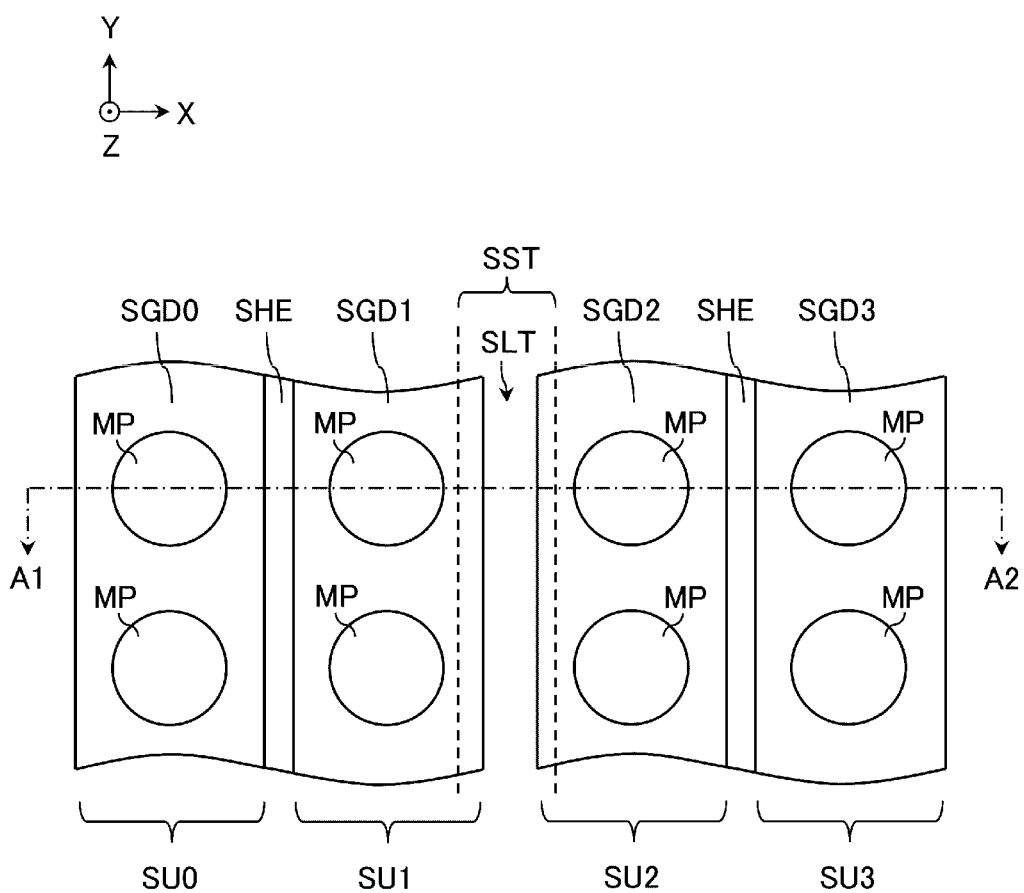
FIG. 3 is a plan view of the memory cell array in the semiconductor memory device according to the first embodiment.

Next, a planar configuration of the memory cell array 111 will be described with reference to FIG. 3. FIG. 3 is a plan view of the string units SU0 to SU3 in one block BLK. In an example of FIG. 3, interlayer insulating films are omitted.

As illustrated in FIG. 3, a slit SHE extending along a Y direction parallel to a semiconductor substrate is formed between the select gate line SGD0 of the string unit SU0 and the select gate line SGD1 of the string unit SU1, and the select gate lines SGD0 and SGD1 are separated from each other. Below the select gate lines SGD0 and SGD1, the word lines WL, the dummy word lines WLD, and the select gate lines SGS and SGSB, which are shared by the string units SU0 and SU1 and are not illustrated, are stacked. The same is true in the string units SU2 and SU3. A slit SLT extending along the Y direction is formed between the string units SU1 and SU2. A bottom surface of the slit SLT reaches the source line SL (not illustrated) provided in the lowermost layer of the memory cell array 111. The select gate lines SGD, SGS, and SGSB, the word lines WL, and the dummy word lines WLD are separated from each other by the slit SLT. In the source line SL, a slit SST is formed, which is disposed below the slit SLT and extends in the Y direction. In an X direction perpendicular to the Y direction and parallel to the semiconductor substrate, a width of the slit SST is wider than a width of the slit SLT. The slit SST will be described later.

In each string unit SU, a plurality of memory pillars MP extending in a Z direction perpendicular to the semiconductor substrate are formed. One memory pillar MP corresponds to one NAND string NS. In the example of FIG. 3, in each string unit SU, a plurality of memory pillars MP are arranged in a row along the Y direction. For example, upper ends of the memory pillars MP of each string unit SU arranged along the X direction are commonly connected to the bit line BL (not illustrated). Bottom surfaces of the plurality of memory pillars MP are commonly connected to the source line SL.

An arrangement of the memory pillars MP in one string unit SU may be randomly set. For example, in one string unit SU, the memory pillars MP may be arranged in parallel in two rows along the X direction, or may be disposed in a zigzag arrangement of four rows.

1.1.4 Sectional Configuration of Memory Cell Array

Figure 4:
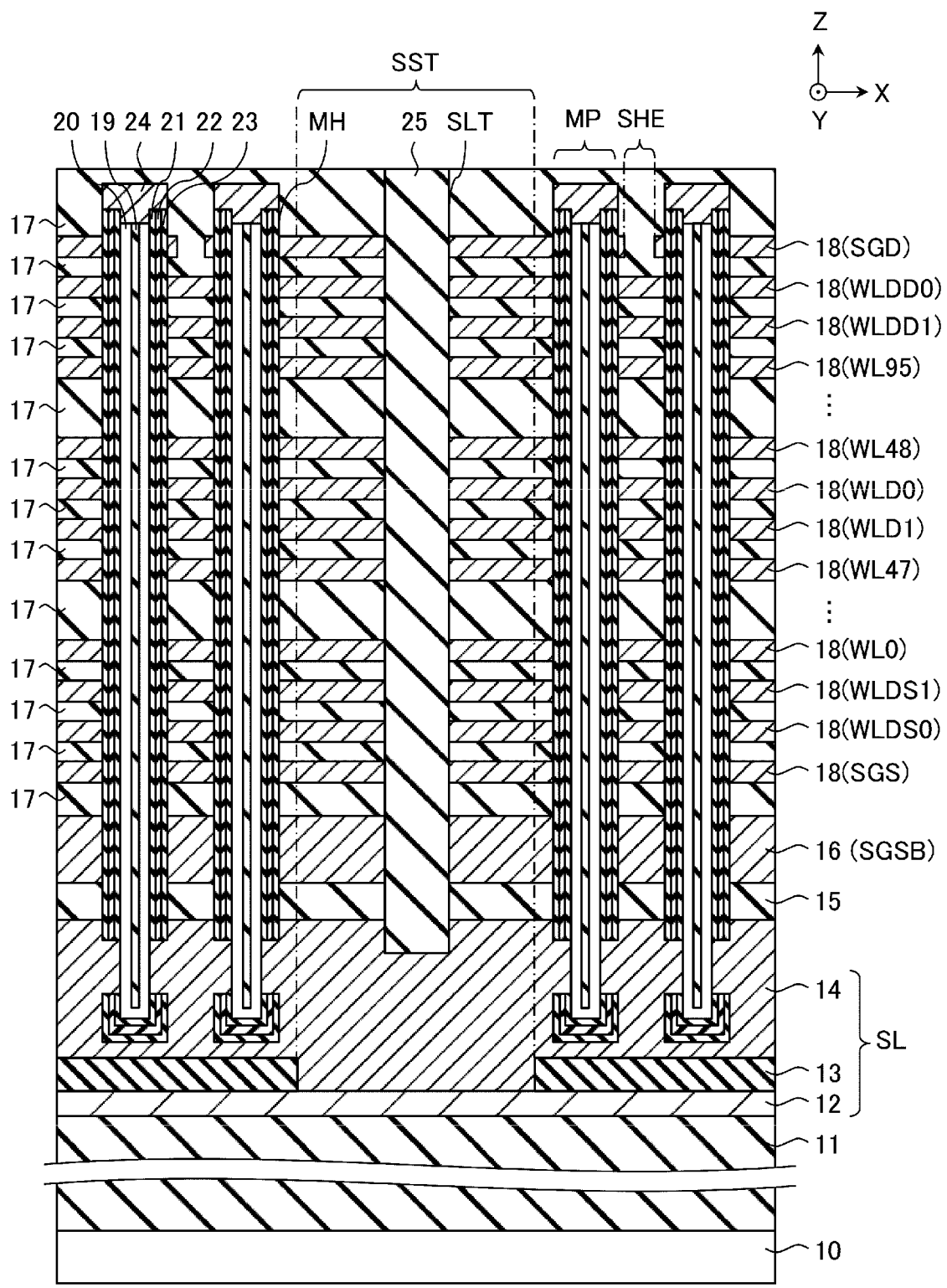
FIG. 4 is a sectional view of the memory cell array taken along a line A1-A2 of FIG. 3.

Next, a sectional configuration of the memory cell array 111 will be described with reference to FIG. 4. FIG. 4 is a sectional view of the memory cell array taken along a line A1-A2 of FIG. 3. In an example of FIG. 4, in order to simplify an explanation, a contact formed on the memory pillar MP and the bit line BL connected to the contact are omitted.

As illustrated in FIG. 4, an insulating layer 11 is formed on the semiconductor substrate 10. As the insulating layer 11, for example, a silicon oxide film ($SiO_2$) is used. Circuits of the memory core unit 110, for example, the row decoder 112 and the sense amplifier 113, may be provided on a region in which the insulating layer 11 is formed, that is, a region between the semiconductor substrate 10 and the source line SL.

A metal layer 12 and a conductive layer 14 which function as the source line SL are stacked on the insulating layer 11. An adhesive layer 13 is formed in a portion between the metal layer 12 and the conductive layer 14. The adhesive layer 13 is used for improving adhesion between the metal layer 12 and the conductive layer 14.

For the metal layer 12, for example, a metal material such as tungsten (W), tungsten silicide (WSi), or tungsten nitride (WN) may be used. Hereinafter, in the present embodiment, a case where WSi is used for the metal layer 12 will be described. As a conductive material of the conductive layer 14, for example, an n-type semiconductor in which an impurity is added to a semiconductor such as silicon (Si) is used. Hereinafter, in the present embodiment, a case where a phosphorus-doped polysilicon (P-doped poly-Si) is used as the conductive layer 14 will be described as an example. The adhesive layer 13 may be formed of a conductive material or an insulating material as long as the adhesive layer can improve adhesion between the metal layer 12 and the conductive layer 14. Hereinafter the adhesive layer 13 will be described, having $SiO_2$ formed by plasma chemical vapor deposition (CVD) using silane ($SiH_4$).s.

In an example of FIG. 4, a portion of the adhesive layer 13 is removed along the Y direction, and the slit SST extending in the Y direction is formed. For example, in a case where the adhesive layer 13 is formed of an insulating material such as $SiO_2$, the slit SST electrically connects the metal layer 12 and the conductive layer 14. The slit SLT is disposed above a region in which the slit SST is formed. For example, in the conductive layer 14, a film thickness of a region in which the slit SST is formed is thicker than a film thickness of a region in which the adhesive layer 13 is formed.

An insulating layer 15 and a wiring layer 16 functioning as the select gate line SGSB are stacked on the conductive layer 14. Further, 104 wiring layers 18, which function as the select gate line SGS, the dummy word lines WLDS0 and WLDS1, the word lines WL0 to WL47, the dummy word lines WLD1 and WLD0, the word lines WL48 to WL95, the dummy word lines WLDD1 and WLDD0, and the select gate line SGD in order from the lower layer, are stacked on the wiring layer 16 with insulating layers 17 interposed between each of the wiring layers. That is, the 104 wiring layers 18 are separated from each other in the Z direction. An insulating layer 17 is formed on the uppermost wiring layer 18. For the insulating layers 15 and 17, for example, SiO$_2$ is used. As a conductive material of the wiring layers 16 and 18, for example, a metal material such as W, an n-type semiconductor, a p-type semiconductor, or the like may be used. Described next is an embodiment wherein phosphorus-doped polysilicon is used for the wiring layer 16, W is used for the wiring layer 18, and titanium nitride (TiN) is used as a barrier metal of the wiring layer 18.

The slit SLT is formed so as to penetrate the 104 wiring layers 18, the wiring layer 16, the plurality of insulating layers 17, and the insulating layer 15 and reach the conductive layer 14. The inside of the slit SLT is filled with an insulating layer 25. For the insulating layer 25, for example, SiO$_2$ is used.

The memory pillar MP includes a core layer 19, a semiconductor layer 20, a tunnel insulating film 21, a charge storage layer 22, a block insulating film 23, and a cap layer 24.

More specifically, a memory hole MH is formed so as to penetrate the 104 wiring layers 18, the wiring layer 16, the plurality of insulating layers 17, and the insulating layer 15 and to reach the conductive layer 14. The block insulating film 23, the charge storage layer 22, and the tunnel insulating film 21 are sequentially formed on a portion of a side surface and a bottom surface of the memory hole MH. The inside of the memory hole MH is filled with the semiconductor layer 20 and the core layer 19, and the cap layer 24 is provided on an upper portion of the memory hole MH. The semiconductor layer 20 is a region in which channels of the memory cell transistors MT and the select transistors ST1 and ST2 (ST2a and ST2b) are formed. The block insulating film 23, the charge storage layer 22, and the tunnel insulating film 21 on the side surface of the memory hole MH are formed such that the wiring layers 18 and the wiring layer 16 are not in contact with the semiconductor layer 20. That is, in the memory hole MH, the block insulating film 23, the charge storage layer 22, and the tunnel insulating film 21 are formed in a portion of the side surface including a region in contact with the wiring layers 18 and the wiring layer 16. The block insulating film 23, the charge storage layer 22, and the tunnel insulating film 21 are removed from the upper portion of the memory hole MH and a portion of a region in contact with the conductive layer 14. Thereby, a portion of a side surface of the semiconductor layer 20 is in contact with the conductive layer 14.

The memory cell transistors MT0 to MT95 are configured with the memory pillar MP and the wiring layers 18 functioning as the word lines WL0 to WL95. In other words, one storage portion is disposed between one wiring layer 18 functioning as the word line WL and the semiconductor layer 20. Similarly, the dummy memory cell transistors MTDD0, MTDD1, MTD0, MTD1, MTDS0, and MTDS1 are configured with the memory pillar MP and the wiring layers 18 functioning as the dummy word lines WLDD0, WLDD1, WLD0, WLD1, WLDS0, and WLDS1. The select transistors ST1 and ST2a are configured with the memory pillar MP and the wiring layers 18 functioning as the select gate lines SGD and SGS. The select transistor ST2b is configured with the memory pillar MP and the wiring layer 16 functioning as the select gate line SGSB.

Silicon dioxide is used, for example for the block insulating film 23, the tunnel insulating film 21, and the core layer 19. For the charge storage layer 22, for example, a silicon nitride film (SiN) is used. For the semiconductor layer 20, for example, polysilicon is used. As a conductive material of the cap layer 24, for example, a metal material such as W, an n-type semiconductor, or the like may be used.

The memory pillar MP may have a stacked structure of two or more stages.

1.2 Manufacturing Method of Memory Cell Array

Next, a manufacturing method of the memory cell array 111 will be described with reference to FIG. 5 to FIG. 13. In the present embodiment, a method of forming the wiring layers 18 by forming a structure corresponding to the wiring layers 18 using sacrificial layers 34, removing the sacrificial layers 34, and filling the removed sacrificial layers 34 with a conductive material (hereinafter, referred to as "backfilling") will be described. Hereinafter, a case where SiN is used as the sacrificial layers 34 and a stacked film of TiN and W is used as a conductive material of the wiring layers 18 will be described. When forming W, TiN functions as a barrier layer for preventing, for example, reaction between W and Si, or as an adhesive layer for improving adhesion of W. A material of the sacrificial layer 34 is not limited to SiN. For example, a silicon oxynitride film (SiON) may be used as long as the material can obtain a sufficient selection ratio between the insulating layer 17 (for example, SiO$_2$) and the sacrificial layer 34 in wet etching.

Figure 5:
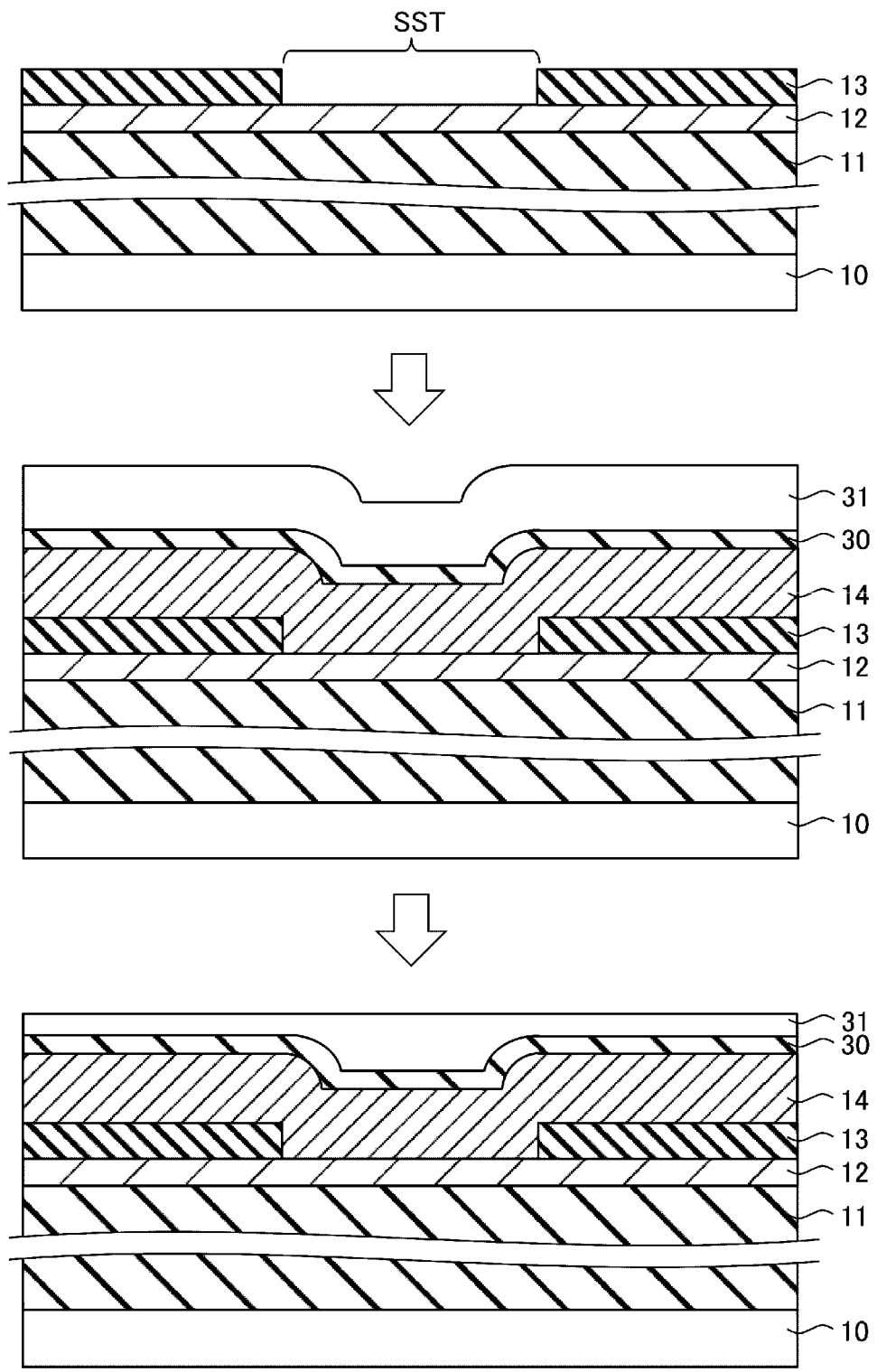
FIG. 5 is a view illustrating a manufacturing process of the memory cell array in the semiconductor memory device according to the first embodiment.

As illustrated in FIG. 5, an insulating layer 11, a metal layer 12, and an adhesive layer 13 are stacked on the semiconductor substrate 10. A slit SST is formed by machining the adhesive layer 13.

Next, a conductive layer 14, an insulating layer 30, and a semiconductor layer 31 are stacked. For the insulating layer 30, for example, SiO$_2$ is used. For the semiconductor layer 31, for example, amorphous silicon (amorphous Si) is used. At this time, a region in which the slit SST is formed has a recess shape.

Next, planarization of a front surface of the semiconductor layer 31 is performed by chemical mechanical polishing (CMP). Thereby, in the region in which the slit SST is formed, the adhesive layer 13 does not exist, and thus a film thickness of the semiconductor layer 31 in the Z direction is thicker than those of the other regions by a film thickness of the adhesive layer 13.

Figure 6:
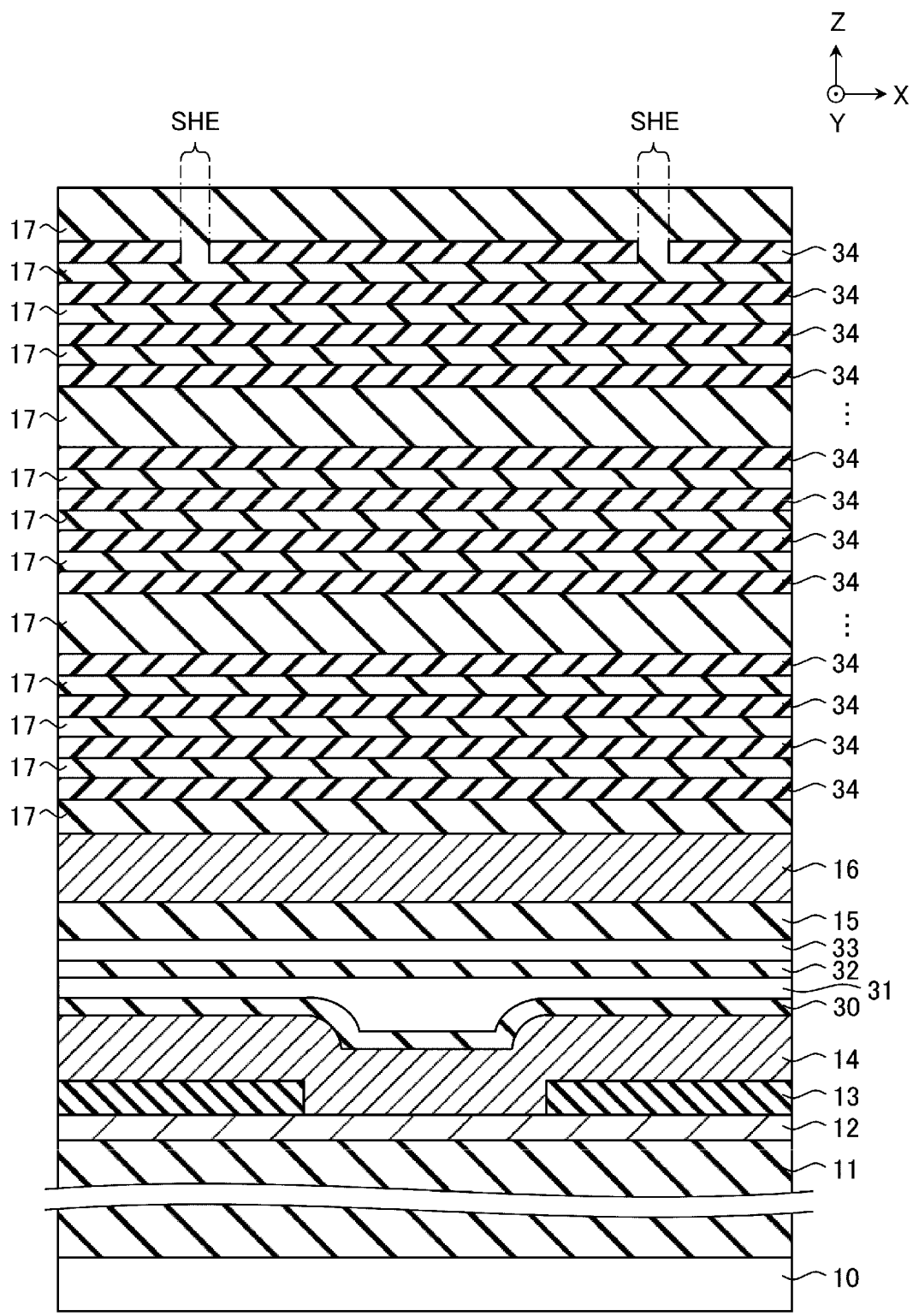
FIG. 6 is a view illustrating a manufacturing process of the memory cell array in the semiconductor memory device according to the first embodiment.

As illustrated in FIG. 6, an insulating layer 32, a semiconductor layer 33, an insulating layer 15, and a wiring layer 16 are sequentially stacked on the semiconductor layer 31. For the insulating layer 32, for example, SiO$_2$ is used, and for the semiconductor layer 33, for example, undoped amorphous silicon is used. One hundred four (104) sacrificial layers 34 are subsequently formed on the wiring layer 16 with insulating layers 17 interposed between each of the sacrificial layers. After a slit SHE is formed on the uppermost sacrificial layer 34, an insulating layer 17 is formed on an upper surface of the uppermost sacrificial layer 34.

Figure 7:
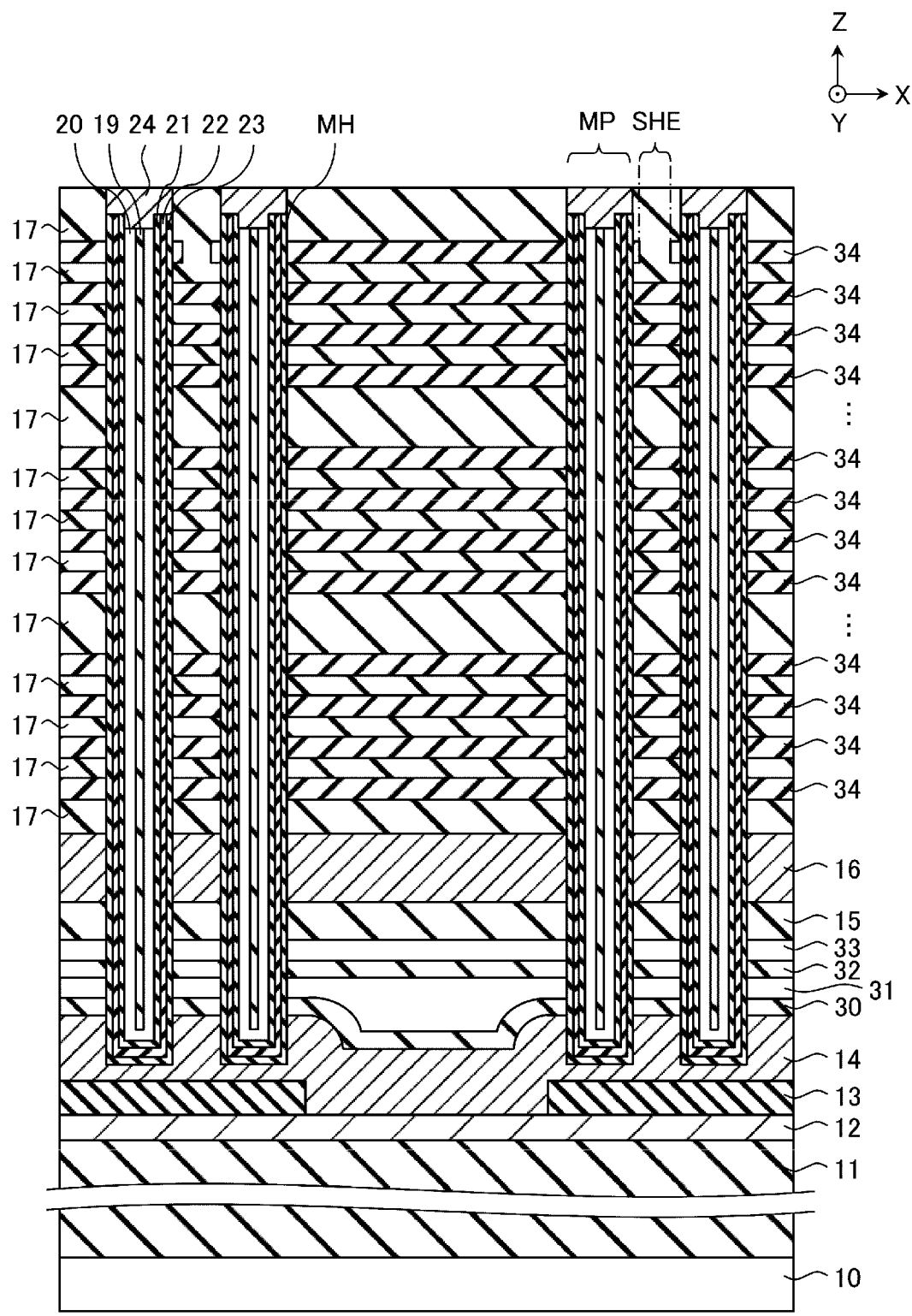
FIG. 7 is a view illustrating a manufacturing process of the memory cell array in the semiconductor memory device according to the first embodiment.

As illustrated in FIG. 7, a memory hole MH is formed such that a bottom surface of the memory hole reaches the conductive layer 14, and a block insulating film 23, a charge storage layer 22, a tunnel insulating film 21, a semiconductor layer 20, and a core layer 19 are sequentially stacked. In a case where the inside of the memory hole MH is filled with the semiconductor layer 20, or in a case where an opening of the memory hole MH is closed, the core layer 19 may not be formed inside the memory hole MH. Excess portions of the block insulating film 23, the charge storage layer 22, the tunnel insulating film 21, the semiconductor layer 20, and the core layer 19 on the insulating layer 17 are removed by, for example, dry etching. At this time, in the upper portion of the memory hole MH, the block insulating film 23, the charge storage layer 22, the tunnel insulating film 21, the semiconductor layer 20, and the core layer 19 are partly etched. Thereafter, a cap layer 24 is formed such that the upper portion of the memory hole MH is filled with the cap layer 24. The cap layer 24 on the insulating layer 17 is removed by, for example, CMP, dry etching, or the like.

Figure 8:
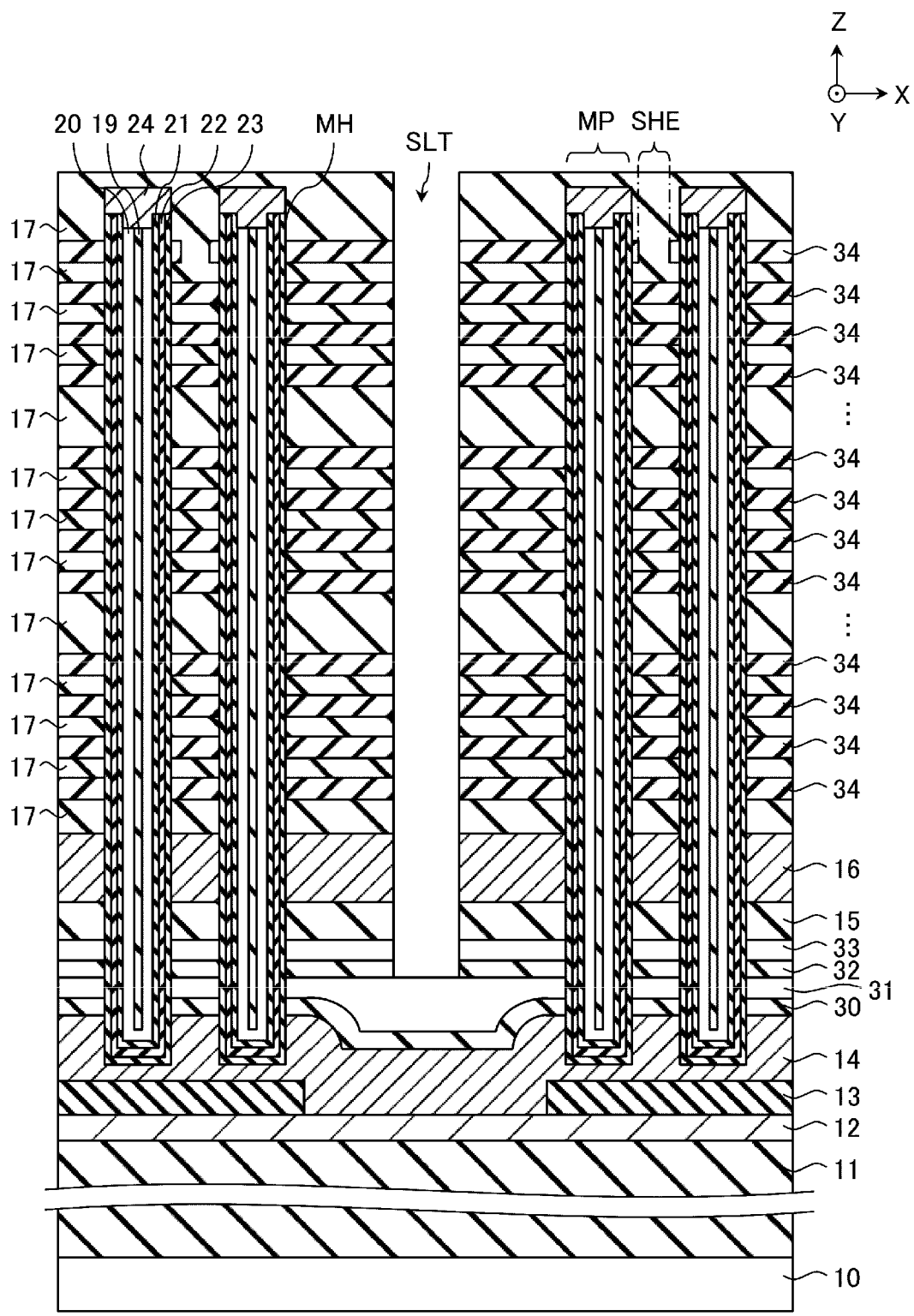
FIG. 8 is a view illustrating a manufacturing process of the memory cell array in the semiconductor memory device according to the first embodiment.

As illustrated in FIG. 8, after an insulating layer 17 is formed on the cap layer 24, a slit SLT is formed such that a bottom surface of the slit reaches the semiconductor layer 31. The semiconductor layer 31 functions as an etching stopper film when machining the slit SLT.

Figure 9:
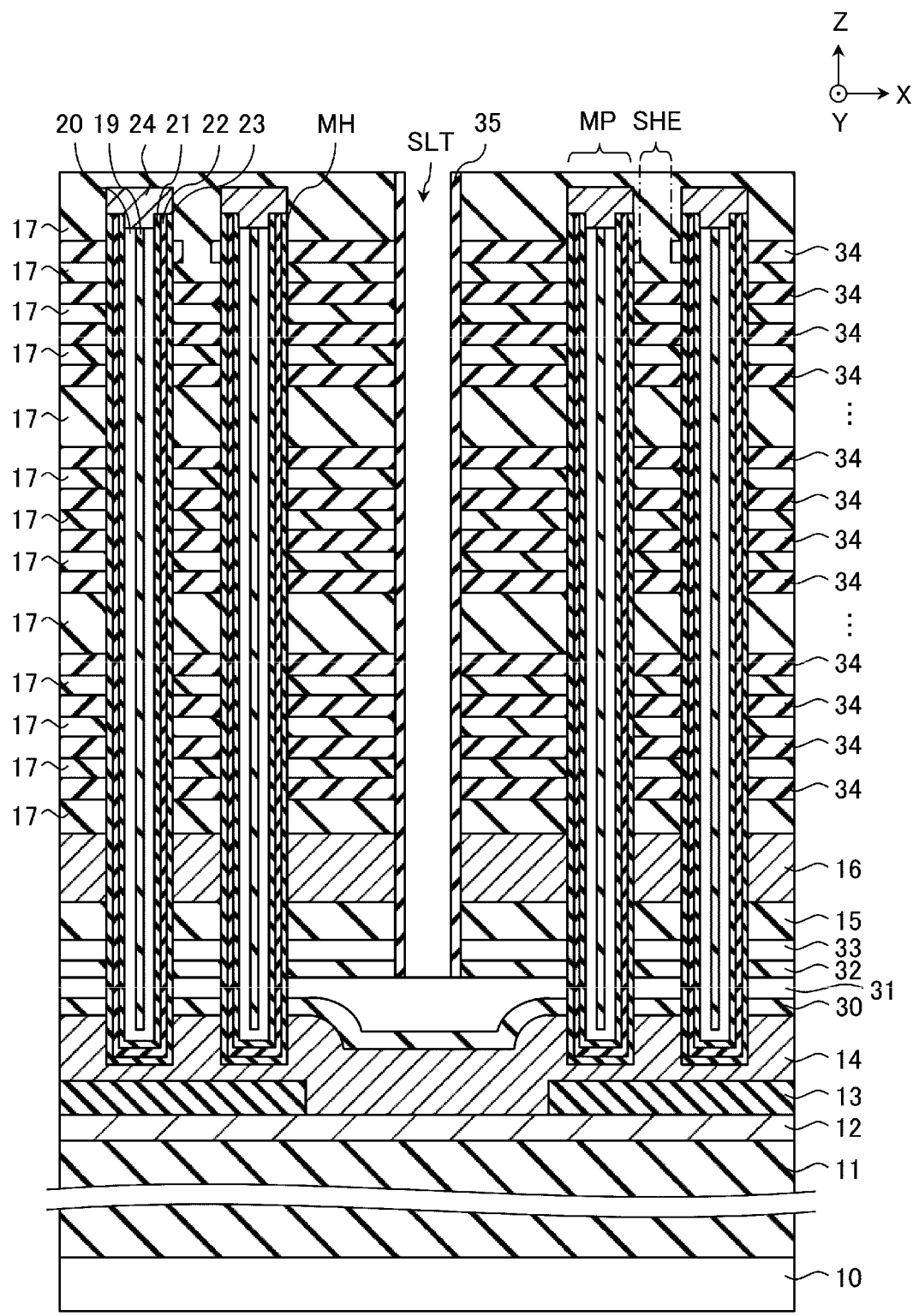
FIG. 9 is a view illustrating a manufacturing process of the memory cell array in the semiconductor memory device according to the first embodiment.

As illustrated in FIG. 9, an insulating layer 35 is formed on side surfaces of the slit SLT. More specifically, after the insulating layer 35 having a thin thickness is formed so as not to fill the inside of the slit SLT, portions of the insulating layer 35 that are positioned on the insulating layer 17 and a bottom portion of the slit SLT are removed by dry etching. For the insulating layer 35, for example, SiN is used.

Figure 10:
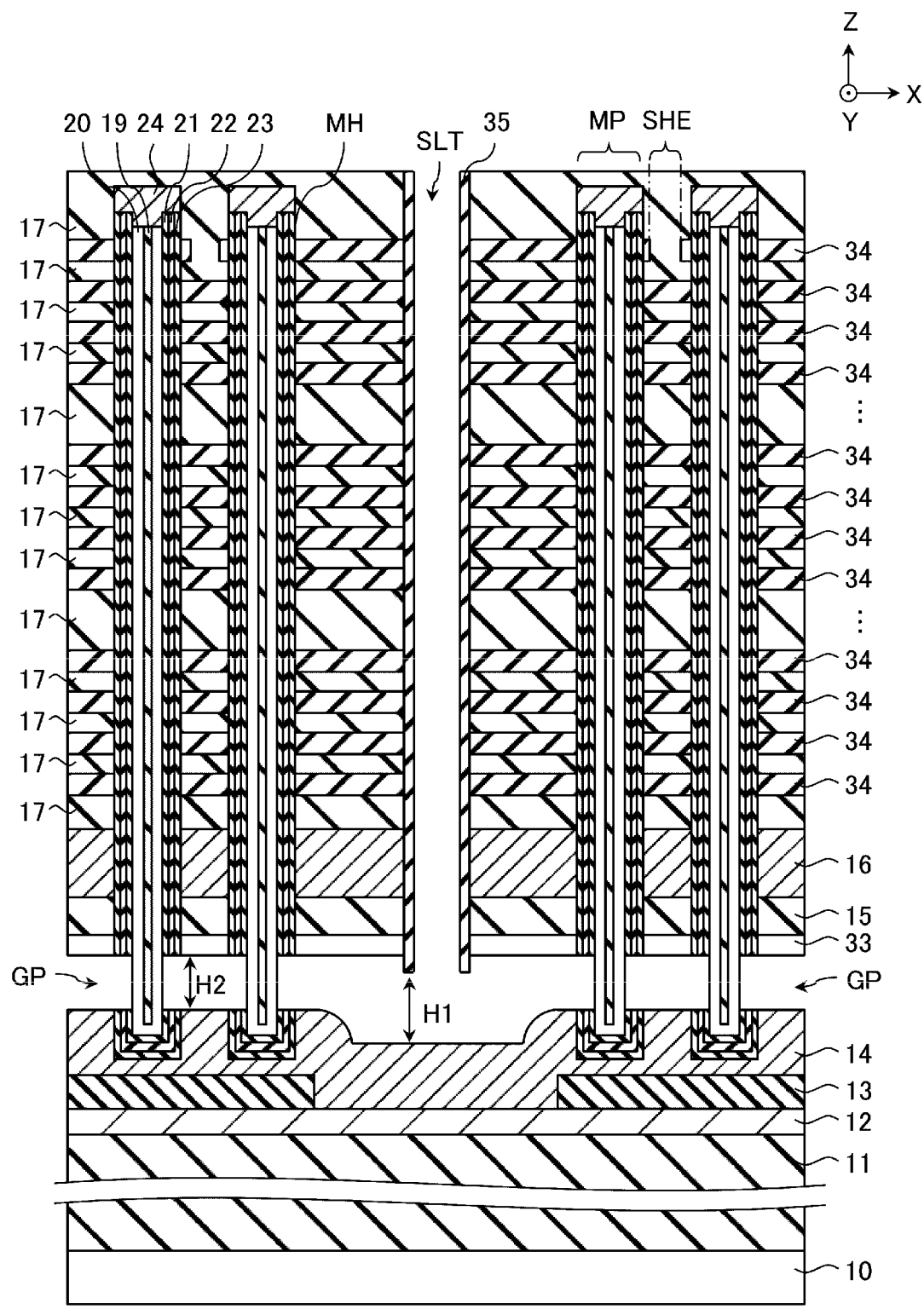
FIG. 10 is a view illustrating a manufacturing process of the memory cell array in the semiconductor memory device according to the first embodiment.

As illustrated in FIG. 10, first, the semiconductor layer 31 is removed by, for example, wet etching using an alkaline chemical solution. Next, the insulating layers 30 and 32 are removed by wet etching using a hydrofluoric acid-based chemical solution, and thus a gap GP is formed between the conductive layer 14 and the semiconductor layer 33. At this time, the block insulating film 23, the charge storage layer 22, and the tunnel insulating film 21 in the gap GP are also removed by wet etching, and thus the semiconductor layer 20 is exposed.

By removing the insulating layer 32, in the gap GP, a bottom portion of the insulating layer 35 protrudes downward (hereinafter, referred to as "protrusion"). By making a film thickness of the adhesive layer 13 thicker than a film thickness of the insulating layer 32 in the Z direction, in the gap GP, a distance H1 from the bottom portion of the insulating layer 35 (protrusion) to an upper surface of the conductive layer 14 is longer than a distance H2 from a bottom portion of the semiconductor layer 33 in another region in which the adhesive layer 13 exists to an upper surface of the conductive layer 14.

Figure 11:
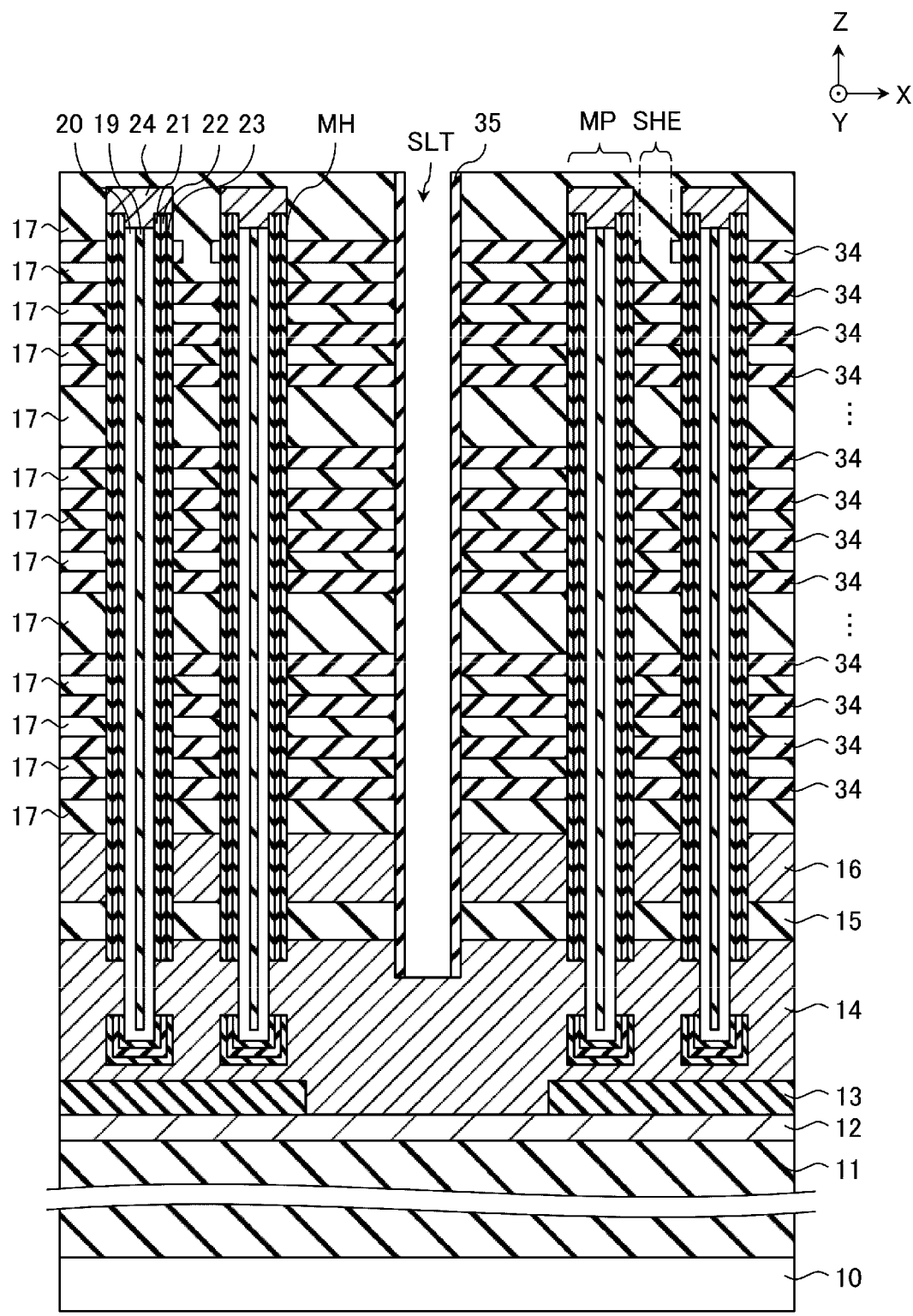
FIG. 11 is a view illustrating a manufacturing process of the memory cell array in the semiconductor memory device according to the first embodiment.

As illustrated in FIG. 11, the gap GP is filled with a conductive layer 14. Thereafter, excess portions of the conductive layer that are positioned in the slit SLT and on the insulating layer 17 are removed by, for example, wet etching. Thereby, a source line SL is formed by the metal layer 12 and the conductive layer 14.

Next, the sacrificial layers 34 are backfilled with W and TiN, and thus, as illustrated in FIG. 4, wiring layers 18 are formed. More specifically, in a case where the sacrificial layers 34 and the insulating layer 35 are made of SiN, the sacrificial layers 34 and the insulating layer 35 are removed by wet etching using phosphoric acid (H$_3$PO$_4$), and gaps are formed in portions at which the sacrificial layers 34 are removed. Next, TiN and W are sequentially formed by CVD, and thus the gaps are filled with TiN and W. Next, wiring layers 18 are formed by removing TiN and W formed on the side surfaces of the slit SLT, the bottom portion of the slit SLT, and the insulating layer 17, and then the slit SLT is filled with an insulating layer 25 (SiO$_2$).

1.3 Effect According to Present Embodiment

With the configuration according to the present embodiment, it is possible to improve reliability of the semiconductor memory device. This effect will be described in detail.

For example, in a case where the source line SL has a two-layered structure of the metal layer 12 (for example, WSi) and the conductive layer 14 (for example, phosphorus-doped polysilicon), separation may occur at an interface between the metal layer 12 and the conductive layer 14 due to an influence of heat treatment, stress, or the like in subsequent processes.

In contrast, with the configuration according to the present embodiment, the adhesive layer 13 is formed between the metal layer 12 and the conductive layer 14, and thus it is possible to prevent separation between the metal layer 12 and the conductive layer 14, and improve reliability of the semiconductor memory device.

In addition, with the configuration according to the present embodiment, the slit SST is formed by partially removing the adhesive layer 13 on the metal layer 12, and thus, in the region of the slit SST, the metal layer 12 and the conductive layer 14 can be electrically connected to each other.

Further, with the configuration according to the present embodiment, the slit SLT can be formed above the slit SST. Thereby, it is possible to reduce a machining failure of the slit SLT. More specifically, by forming the slit SST, a film thickness of the semiconductor layer 31 above the slit SST can be made thicker than a film thickness of the semiconductor layer 31 above the adhesive layer 13. The semiconductor layer 31 functions as an etching stopper film when machining the slit SLT. Therefore, by forming the slit SLT on a region above the slit SST, the region in which the film thickness of the semiconductor layer 31 is thick, it is possible to increase an over-etching amount when machining the slit SLT, and prevent mis-etching of the slit SLT.

Furthermore, when the gap GP is formed by removing the insulating layer 30, the semiconductor layer 31, and the insulating layer 32 after the slit SLT is machined, the distance H1 from the bottom portion of the insulating layer 35 to the upper surface of the conductive layer 14 can be made longer than the distance H2 from the bottom portion of the semiconductor layer 33 in another region in which the adhesive layer 13 exists to the upper surface of the conductive layer 14. Therefore, when filling the gap GP, the gap GP can be prevented from being blocked due to protrusion of the insulating layer 35, and thus it is possible to prevent formation of pores.

2. Second Embodiment

Next, a second embodiment will be described. In the second embodiment, a shape of the metal layer 12 different from that in the first embodiment will be described. Hereinafter, only differences from the first embodiment will be described.

2.1 Sectional Configuration of Memory Cell Array

Figure 12:
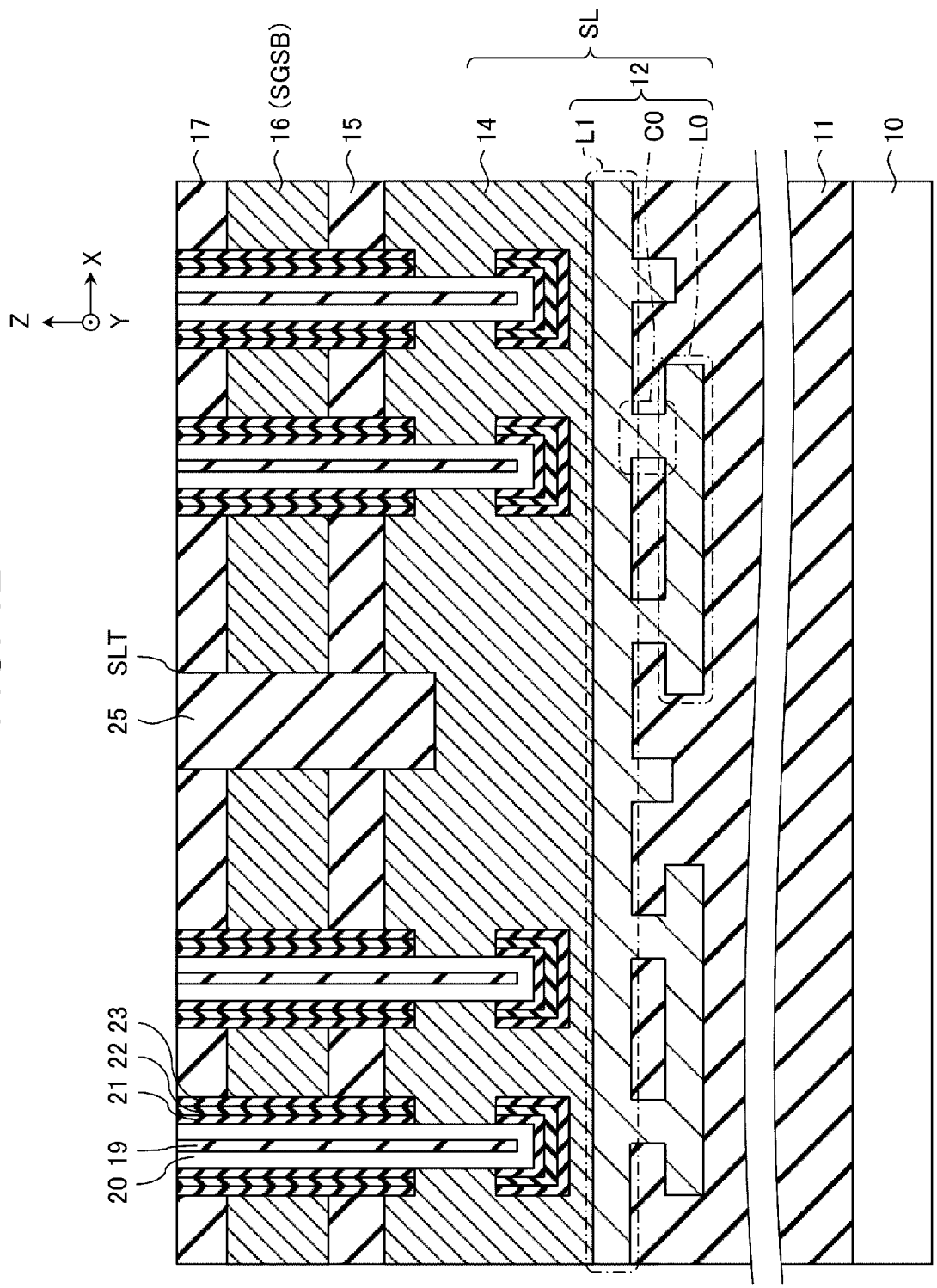
FIG. 12 is a sectional view of a memory cell array in a semiconductor memory device according to a second embodiment.

A sectional configuration of the memory cell array 111 will be described with reference to FIG. 12. In an example of FIG. 12, in order to simplify an explanation, a structure above the wiring layer 16 in FIG. 4 is omitted. In the example of FIG. 12, the adhesive layer 13 is eliminated.

As illustrated in FIG. 12, the metal layer 12 according to the present embodiment has a two-layered wiring structure including a zeroth wiring layer L0, contact plugs C0, and a first wiring layer L1.

More specifically, the zeroth wiring layer L0 is formed in the insulating layer 11, and a plurality of contact plugs C0 are further formed on the zeroth wiring layer L0. The zeroth wiring layer L0 functions as a backing wiring for preventing separation between the first wiring layer L1 and the insulating layer 11. The contact plug C0 may also be formed on a region in which the zeroth wiring layer L0 is not disposed on a lower layer of the contact plug C0. In addition, the contact plug C0 is not disposed, for example, at an end portion of the zeroth wiring layer L0 in the X direction. That is, the contact plug C0 is connected to the zeroth wiring layer L0 at a position away from the end portion of the zeroth wiring layer L0 in the X direction. Thereby, the end portion of the zeroth wiring layer L0 protrudes in the X direction from a connection position of the contact plug C0 and the zeroth wiring layer L0 (hereinafter, such a protrusion shape is referred to as an "anchor shape"). Further, the contact plug C0 may have, for example, a cylindrical shape or a line shape extending in the Y direction. The first wiring layer L1 is formed on the contact plug C0, and a conductive layer 14 is formed on the first wiring layer L1. The zeroth wiring layer L0, the contact plug C0, and the first wiring layer L1 are formed, for example, using the same material. Next described is an embodiment wherein the zeroth wiring layer L0, the contact plug C0, and the first wiring layer L1 are formed using WSi.

The zeroth wiring layer L0, the contact plug C0, and the first wiring layer L1 may be formed of different materials. In this case, materials are selected for the zeroth wiring layer L0, the contact plug C0, and the first wiring layer L1, that have superior adhesion than that between the metal layer 12 and the insulating layer 11.

2.2 Manufacturing Method of Metal Layer

Figure 13:
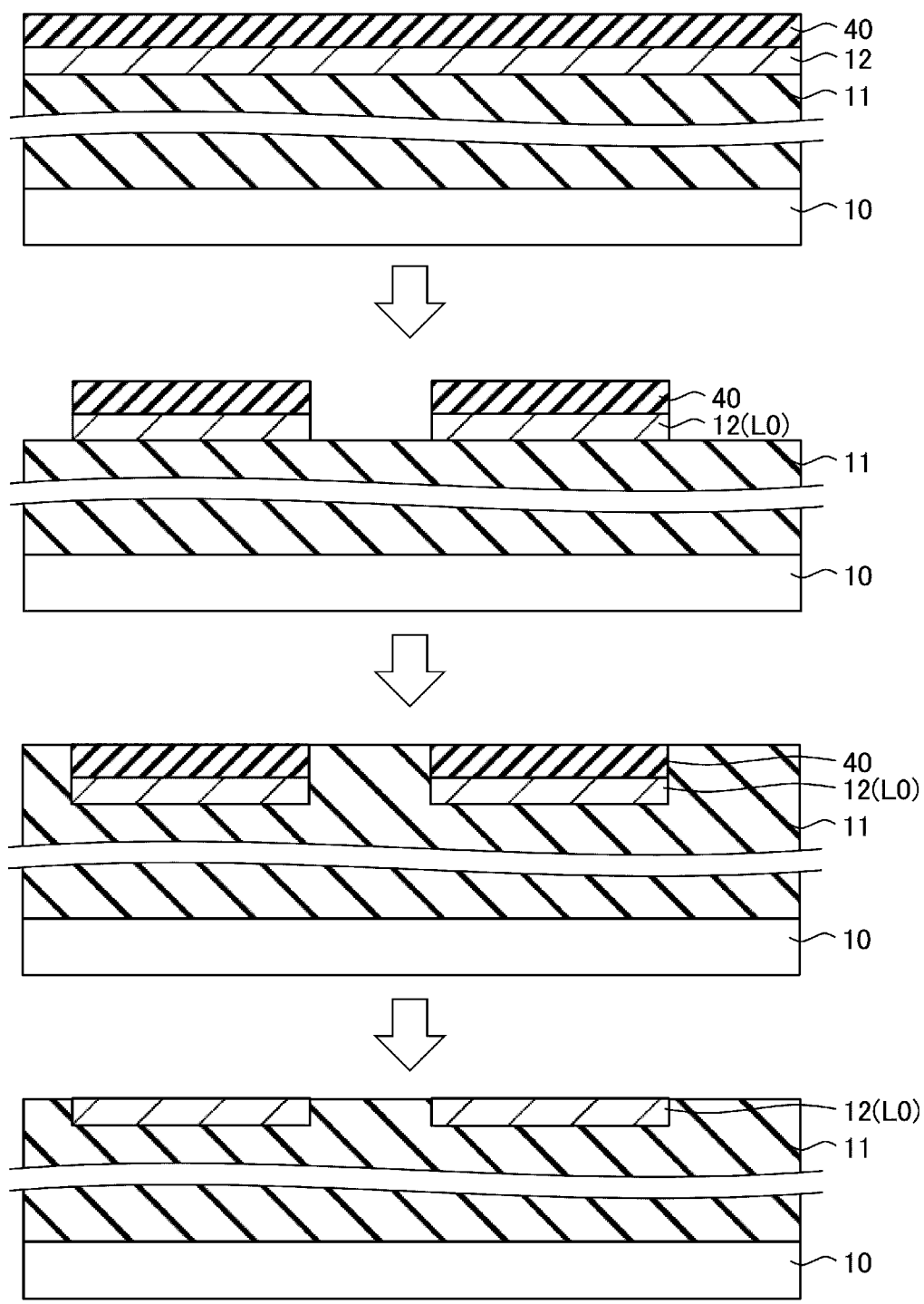
FIG. 13 is a view illustrating a manufacturing process of the memory cell array in the semiconductor memory device according to the second embodiment.
Figure 14:
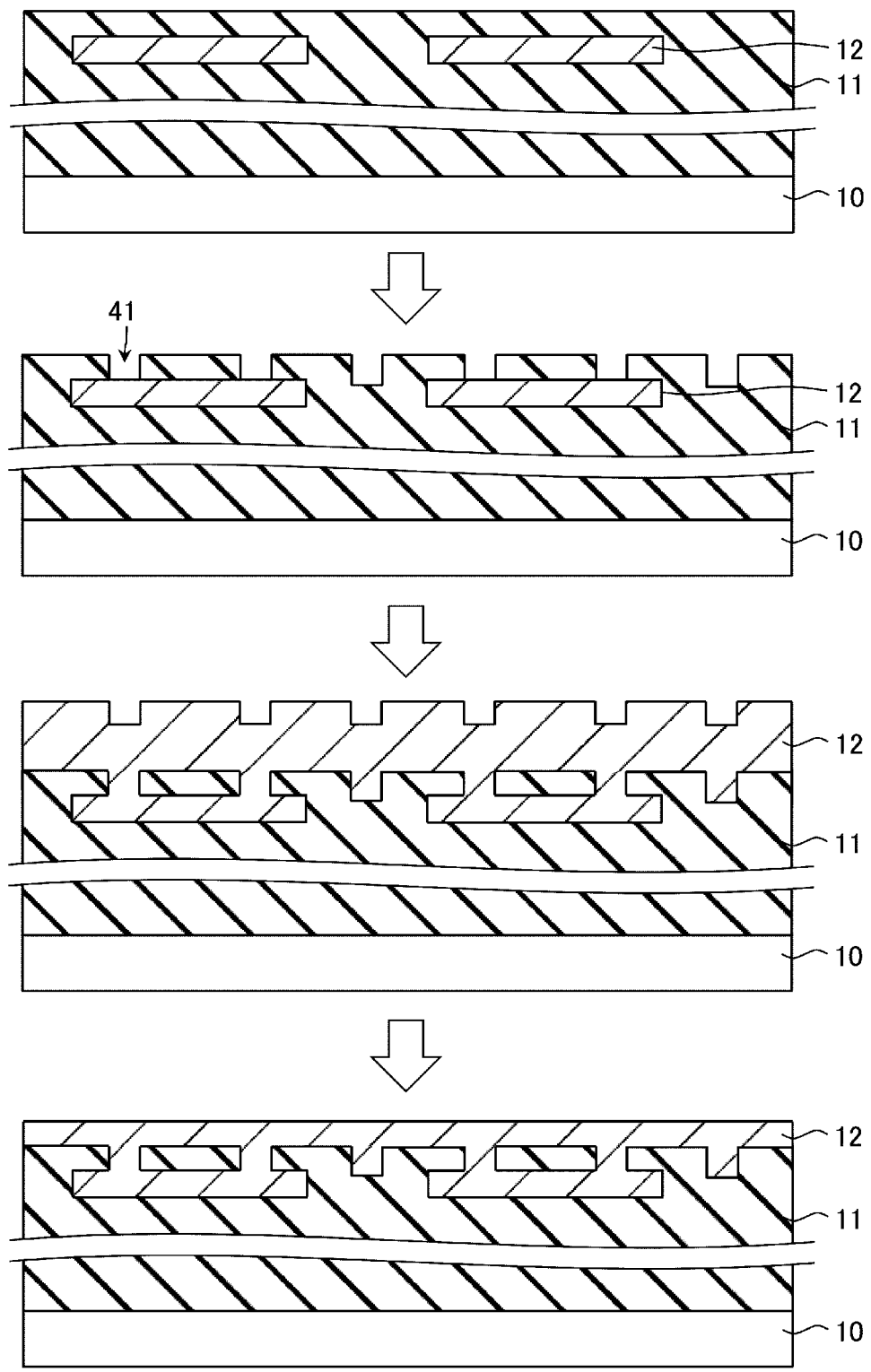
FIG. 14 is a view illustrating a manufacturing process of the memory cell array in the semiconductor memory device according to the second embodiment.

Next, a manufacturing method of the metal layer 12 will be described with reference to FIG. 13 and FIG. 14. FIG. 13 and FIG. 14 illustrate a manufacturing method of the metal layer 12.

As illustrated in FIG. 13, an insulating layer 11, a metal layer 12 corresponding to the zeroth wiring layer L0, and a mask layer 40 are stacked on the semiconductor substrate 10. More specifically, as the insulating layer 11, $SiO_2$ is formed by CVD, for example, using tetra ethyl ortho silicate (TEOS). Next, WSi is formed by sputtering, and then SiN is formed by CVD. The mask layer 40 functions as an etching stopper film when machining the metal layer 12. The mask layer 40 may be made of any material as long as the material can obtain a sufficient selection ratio between the mask layer 40 and the metal layer 12 in etching. For example, SiN is used as the mask layer.

Next, a zeroth wiring layer L0 is formed by machining the mask layer 40 and the metal layer 12.

Next, an insulating layer 11 is formed so as to cover the metal layer 12 and the mask layer 40, and then planarization of a front surface of the insulating layer 11 is performed by CMP so as to expose an upper surface of the mask layer 40.

Next, an upper surface of the metal layer 12 is exposed by etching the mask layer 40 and a front surface of the insulating layer 11.

As illustrated in FIG. 14, next, an insulating layer 11 is formed and covers an upper surface of the metal layer 12.

Next, contact holes 41 corresponding to the contact plugs C0 are formed by machining the insulating layer 11.

Next, a metal layer 12 is formed in a shape corresponding to the contact plugs C0, and thus the contact holes 41 are filled with the metal layer 12.

Next, planarization of a front surface of the metal layer 12 is performed by CMP, and thus the contact plugs C0 and the first wiring layer L1 are formed. Thereby, the metal layer 12 including the zeroth wiring layer L0, the contact plugs C0, and the first wiring layer L1 is formed.

Thereafter, a conductive layer 14 described in the first embodiment is formed on the metal layer 12. The subsequent processes are the same as those in the first embodiment. An adhesive layer 13 described in the first embodiment may be formed on an upper surface of the metal layer 12.

2.3 Effect According to Present Embodiment

With the configuration according to the present embodiment, it is possible to improve reliability of the semiconductor memory device. This effect will be described in detail.

In some cases, separation may occur at an interface between the insulating layer 11 and the metal layer 12 due to an influence of heat treatment, stress, or the like in subsequent processes.

In contrast, with the configuration according to the present embodiment, it is possible to form the metal layer 12 including a backing wiring. More specifically, it is possible to form the metal layer 12 having a two-layered wiring structure including the zeroth wiring layer L0, the contact plugs C0, and the first wiring layer L1. Thereby, it is possible to prevent separation between the metal layer 12 and the insulating layer 11, and improve reliability of the semiconductor memory device.

In addition, with the configuration according to the present embodiment, the zeroth wiring layer L0, that is, the backing wiring has an anchor shape, and thus it is possible to further prevent separation between the metal layer 12 and the insulating layer 11.

Further, with the configuration according to the present embodiment, by forming the plurality of contact plugs C0 on the zeroth wiring layer L0, a contact area between the contact plugs C0 and the zeroth wiring layer L0 or a contact area between the contact plugs C0 and the first wiring layer L1 is increased, and thus it is possible to prevent separation at an interface between the metal layer 12 and the insulating layer 11 in a transverse direction (the X direction or the Y direction).

3. Third Embodiment

Next, a third embodiment will be described. In the third embodiment, a shape of the metal layer 12 different from those in the first embodiment and the second embodiment will be described. Hereinafter, only differences from the first embodiment and the second embodiment will be described.

3.1 Sectional Configuration of Memory Cell Array

Figure 15:
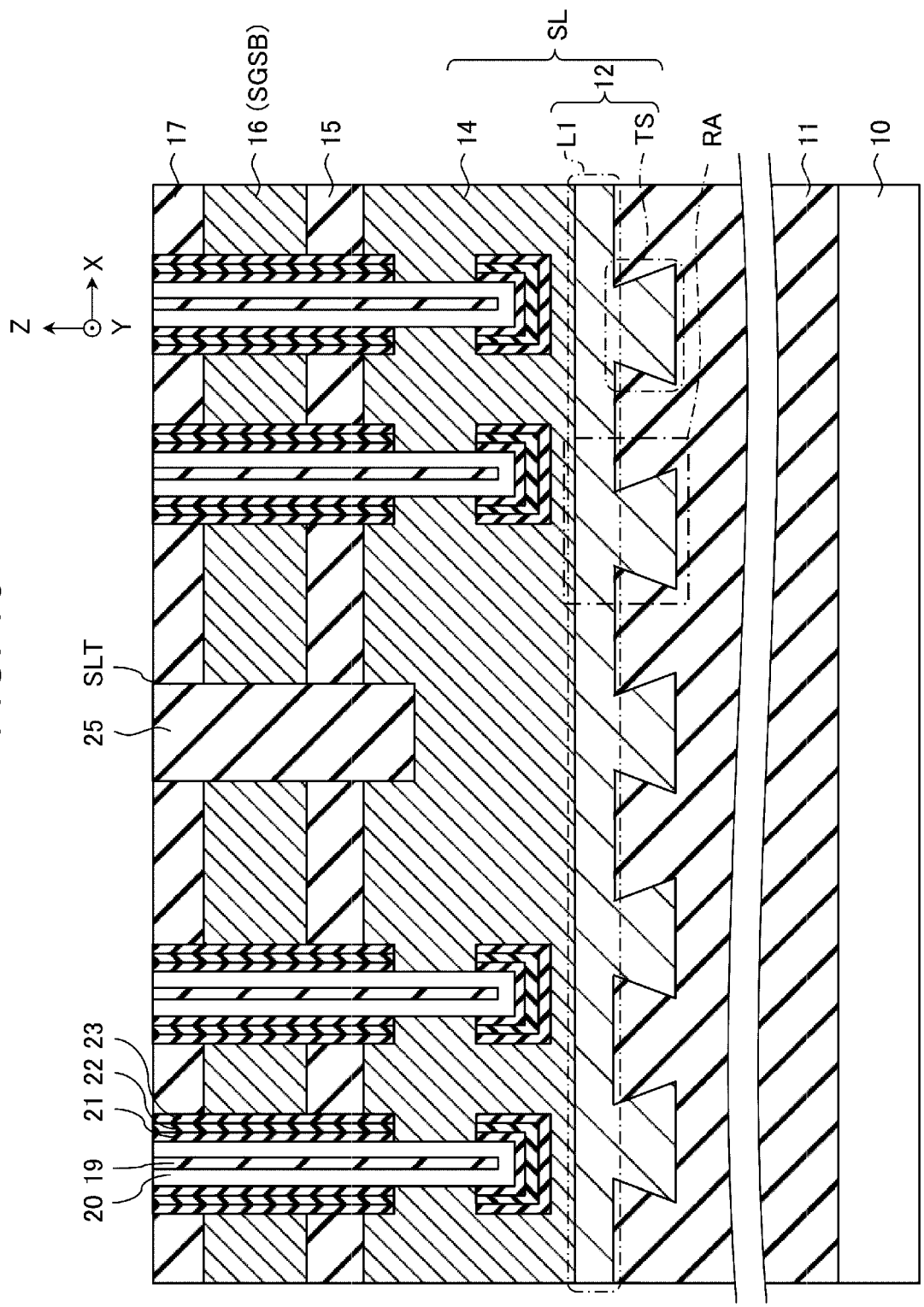
FIG. 15 is a sectional view of a memory cell array in a semiconductor memory device according to a third embodiment.

A sectional configuration of the memory cell array 111 will be described with reference to FIG. 15. In an example of FIG. 15, in order to simplify an explanation, a structure above the wiring layer 16 in FIG. 4 is omitted. In the example of FIG. 15, the adhesive layer 13 is eliminated.

As illustrated in FIG. 15, the metal layer 12 according to the present embodiment includes a first wiring layer L1 and a plurality of projections TS projecting from a bottom surface of the first wiring layer L1 toward the insulating layer 11.

More specifically, the plurality of projections TS are formed in the insulating layer 11, and the first wiring layer L1 is formed on the plurality of projections TS and the insulating layer 11. The projections TS function as a backing wiring for preventing separation between the first wiring layer L1 and the insulating layer 11. A conductive layer 14 is formed on the first wiring layer L1. The projections TS and the first wiring layer L1 are formed, for example, using the same material. The projections TS and the first wiring layer L1 may be formed of different materials. In this case, materials are selected for projections TS and the first wiring layer L1 that have adhesion superior to adhesion between the metal layer 12 and the insulating layer 11.

Figure 16:
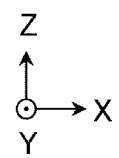
FIG. 16 is a sectional view of the memory cell array in a region of FIG. 15.
Figure 16:
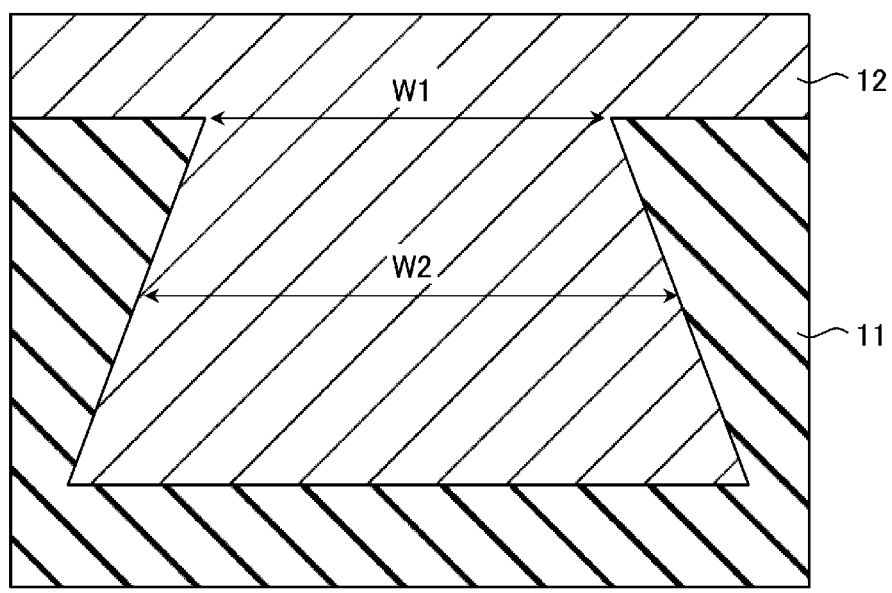

Next, a shape of the projection TS will be described in detail with reference to FIG. 16. FIG. 16 is a sectional view of a region RA in FIG. 15.

As illustrated in FIG. 16, in the X direction, a width W1 of an upper surface of the projection TS in contact with the first wiring layer L1 is narrower than a width W2 of the projection TS at a middle height position in the Z direction. In an example of FIG. 16, in an XZ plane, a section of the projection TS has a trapezoidal shape (or may also be referred to as a "wedge shape" because the shape also looks like a wedge driven to a rear surface of the first wiring layer L1). The section of the projection TS may not have a trapezoidal shape, and for example, a width of a bottom surface of the projection TS may be narrower than the width W2. Further, the projection TS may have, for example, a columnar shape or a line shape extending in the Y direction.

3.2 Manufacturing Method of Metal Layer

Next, two examples of a manufacturing method of the metal layer 12 will be described.

3.2.1 First Example

Figure 17:
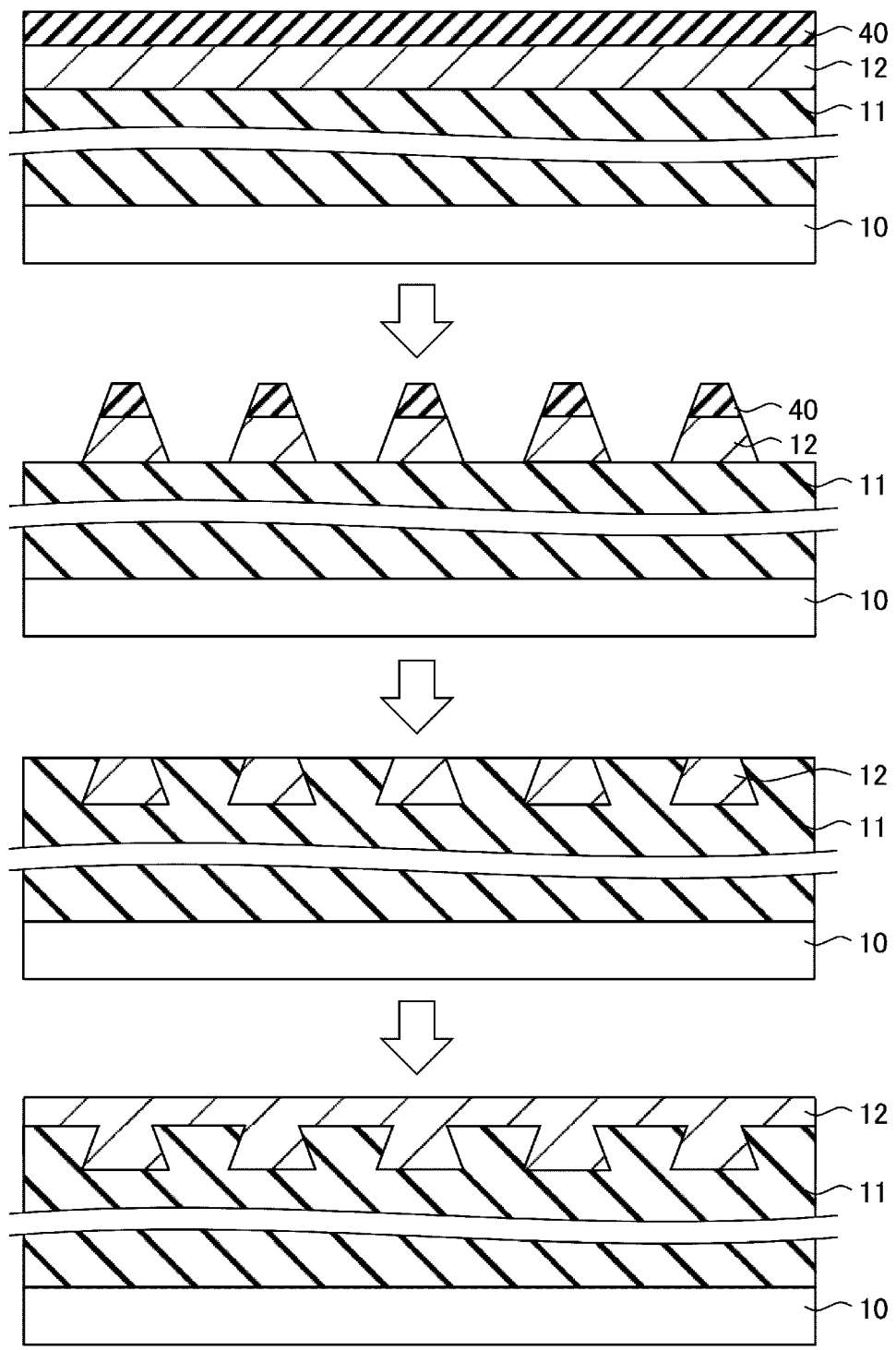
FIG. 17 is a view illustrating a manufacturing process of a memory cell array in a semiconductor memory device according to a first example of the third embodiment.

First, a first example will be described with reference to FIG. 17. FIG. 17 illustrates a manufacturing method of the metal layer 12. In the present example, a case where WSi is used for the metal layer 12 will be described.

As illustrated in FIG. 17, an insulating layer 11, a metal layer 12 corresponding to projections TS, and a mask layer 40 are stacked on the semiconductor substrate 10. More specifically, as the insulating layer 11, for example, SiO$_2$ is formed by CVD. Next, as the metal layer 12, WSi is formed by sputtering, and then, as the mask layer 40, SiN is formed by CVD.

Next, projections TS are formed by machining the mask layer 40 and the metal layer 12. At this time, the mask layer 40 and the metal layer 12 are machined in a shape in which an angle of a side surface with respect to a bottom surface (that is, a semiconductor substrate plane) is less than 90 degrees (hereinafter, referred to as a "taper shape").

Next, an insulating layer 11 is formed, and then planarization of a front surface of the insulating layer 11 is performed by CMP so as to expose an upper surface of the mask layer 40. Further, the mask layer 40 and a front surface of the insulating layer 11 are etched so as to expose an upper surface of the metal layer 12.

Next, a metal layer 12 corresponding to the first wiring layer L1 is formed. Thereby, the metal layer 12 including the projections TS and the first wiring layer L1 is formed.

Thereafter, a conductive layer 14 described in the first embodiment is formed on the metal layer 12. The subsequent processes are the same as those in the first embodiment. An adhesive layer 13 described in the first embodiment may be formed on an upper surface of the metal layer 12.

3.2.2 Second Example

Figure 18:
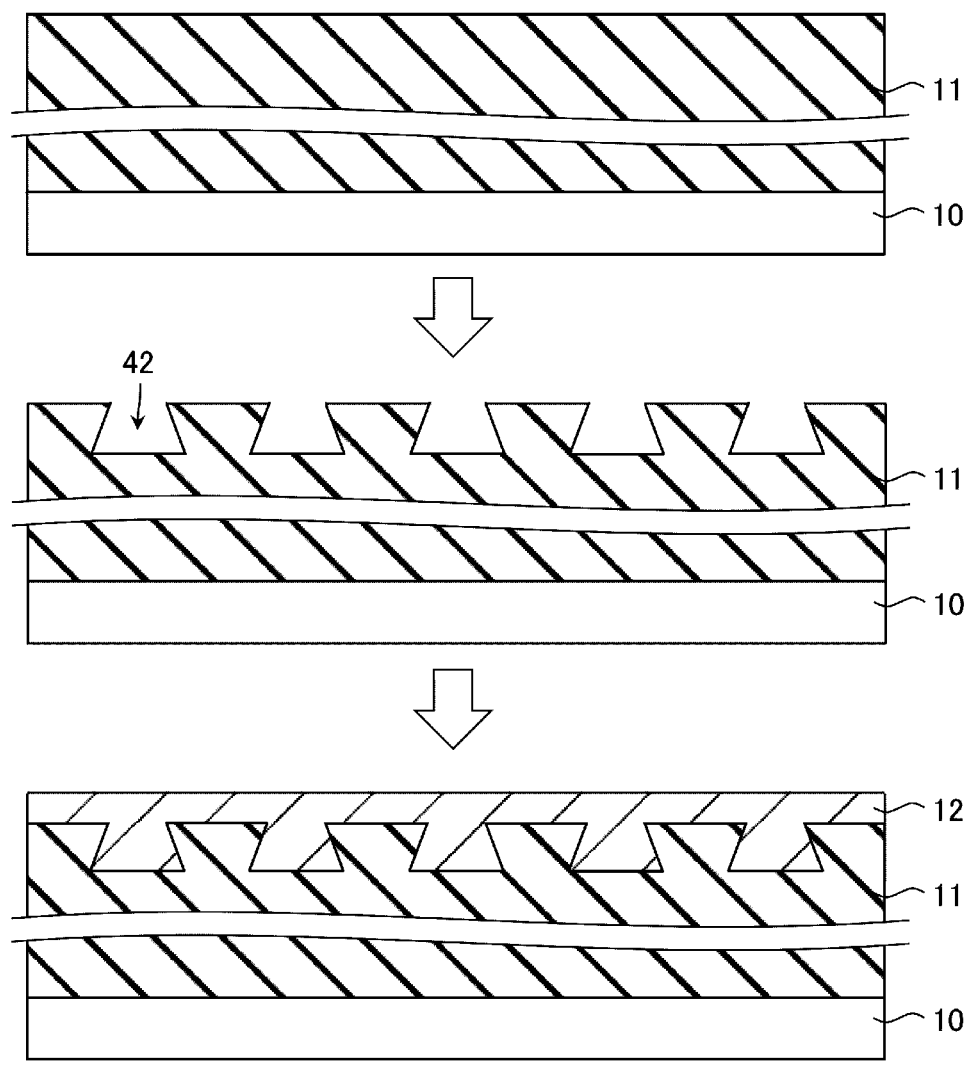
FIG. 18 is a view illustrating a manufacturing process of a memory cell array in a semiconductor memory device according to a second example of the third embodiment.

Next, a second example will be described with reference to FIG. 18. FIG. 18 illustrates a manufacturing method of the metal layer 12. In the present example, a case where W is used for the metal layer 12 will be described.

As illustrated in FIG. 18, an insulating layer 11 is formed on the semiconductor substrate 10, and then holes 42 (or slits 42) corresponding to the projections TS are formed. At this time, the holes 42 are machined in a shape in which an area of an opening (a width in the X direction) is smaller than an area of a bottom surface (a width in the X direction). That is, the holes 42 are machined in a shape in which an angle of a side surface with respect to a bottom surface is larger than 90 degrees (hereinafter, referred to as an "inverted taper shape").

Next, as a barrier metal, TiN is formed by CVD, and then W is formed by CVD so as to fill the holes 42. Then, planarization of a front surface of W is performed by CMP, and thus a metal layer 12 including the projections TS and the first wiring layer L1 is formed.

Thereafter, a conductive layer 14 described in the first embodiment is formed on the metal layer 12. The subsequent processes are the same as those in the first embodiment. An adhesive layer 13 described in the first embodiment may be formed on an upper surface of the metal layer 12.

3.3 Effect According to Present Embodiment

With the configuration according to the present embodiment, effects similar to those according to the second embodiment can be obtained.

4. Fourth Embodiment

Next, a fourth embodiment will be described. In the fourth embodiment, three examples of shapes of the metal layer 12 different from those in the first embodiment to the third embodiment will be described.

4.1 First Example

Figure 19:
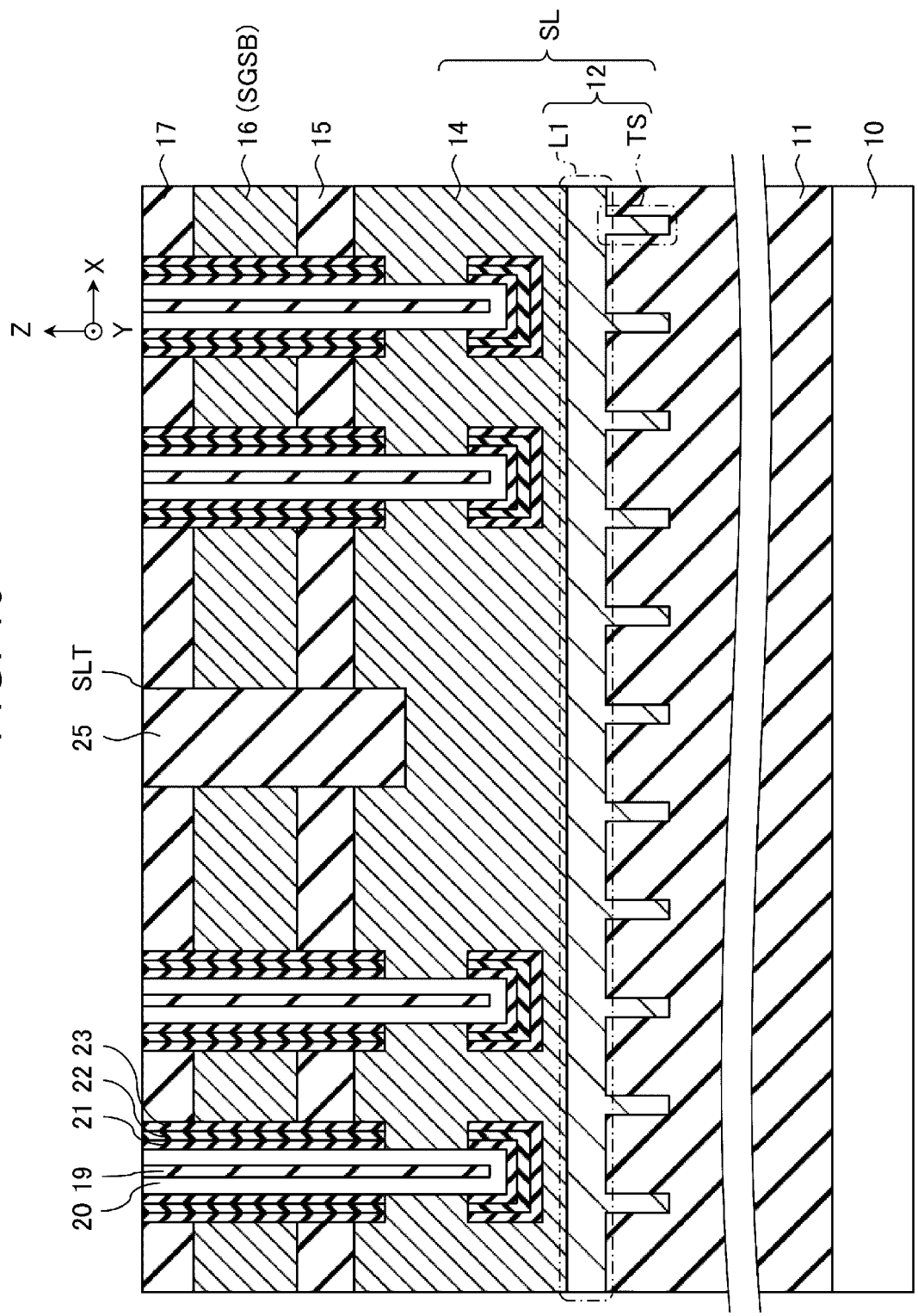
FIG. 19 is a sectional view of a memory cell array in a semiconductor memory device according to a first example of a fourth embodiment.

First, a first example will be described with reference to FIG. 19. In an example of FIG. 19, in order to simplify an explanation, a structure above the wiring layer 16 in FIG. 4 is omitted. In the example of FIG. 19, the adhesive layer 13 is eliminated.

As illustrated in FIG. 19, a metal layer 12 according to the present embodiment includes projections TS and a first wiring layer L1 as in the third embodiment. Unlike the third embodiment of FIG. 15, the projection TS according to the present embodiment has a rectangular shape in the XZ plane. The projection TS may have, for example, a cylindrical shape or a line shape extending in the Y direction. Other configurations are the same as those in the third embodiment.

4.2 Second Example

Figure 20:
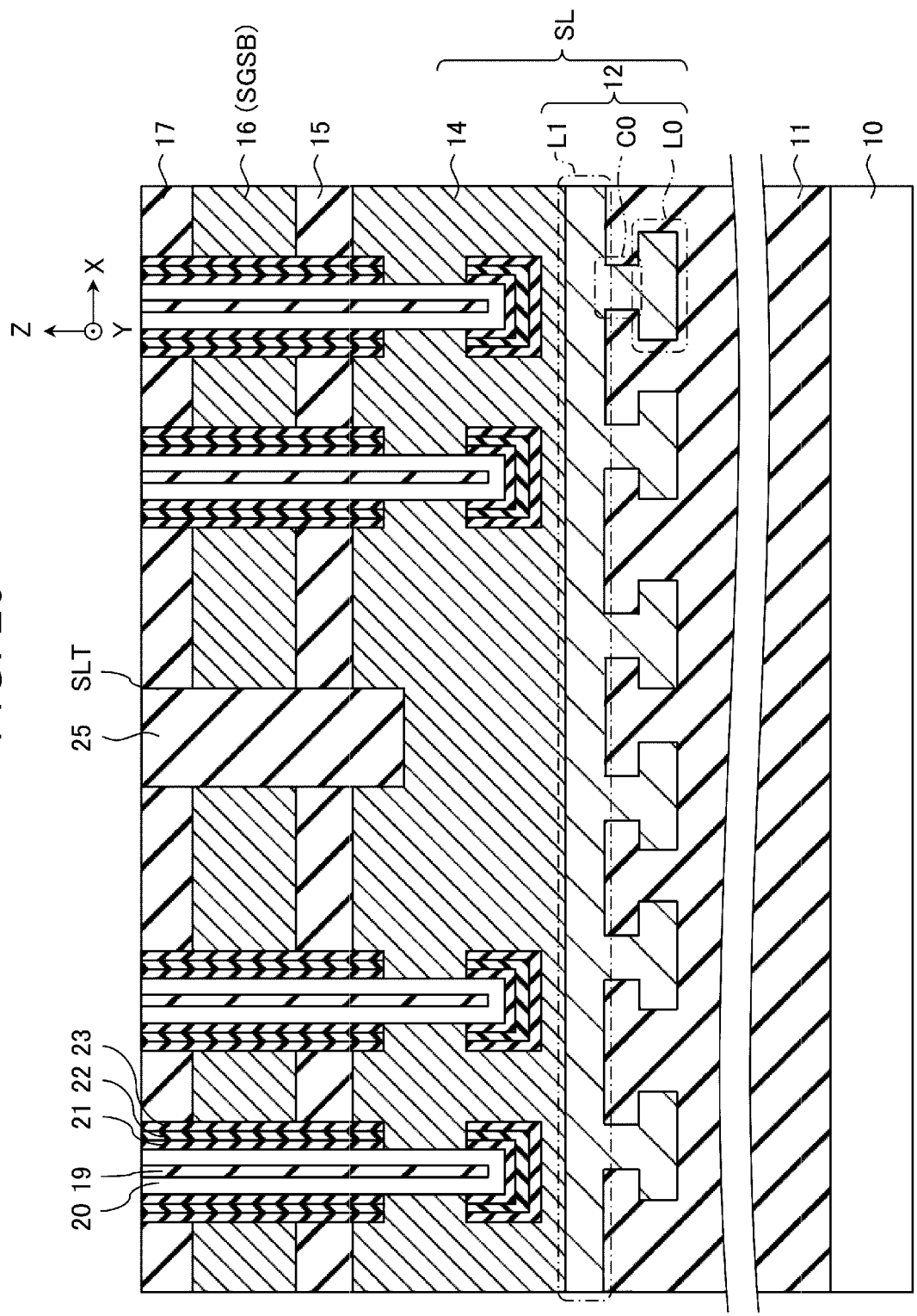
FIG. 20 is a sectional view of a memory cell array in a semiconductor memory device according to a second example of the fourth embodiment.

Next, a second example will be described with reference to FIG. 20. In an example of FIG. 20, in order to simplify an explanation, a structure above the wiring layer 16 in FIG. 4 is omitted. In the example of FIG. 20, the adhesive layer 13 is eliminated.

As illustrated in FIG. 20, the metal layer 12 according to the present embodiment has a two-layered wiring structure including a zeroth wiring layer L0, contact plugs C0, and a first wiring layer L1 as in the second embodiment. Unlike the second embodiment of FIG. 12, in the metal layer 12 according to the present embodiment, one contact plug C0 is provided for one zeroth wiring layer L0. Other configurations are the same as those in the second embodiment.

4.3 Third Example

Figure 21:
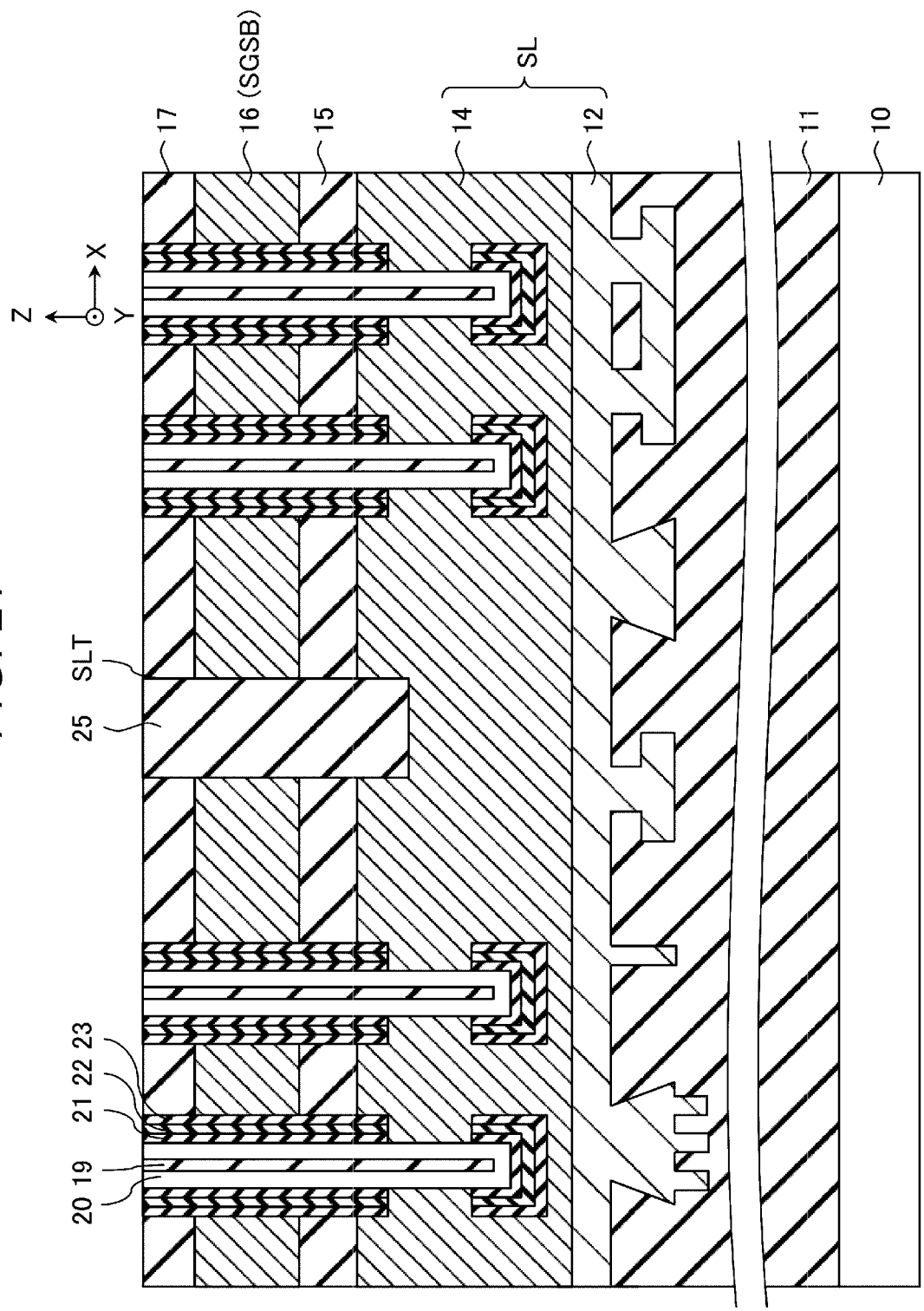
FIG. 21 is a sectional view of a memory cell array in a semiconductor memory device according to a third example of the fourth embodiment.

Next, a third example will be described with reference to FIG. 21. In an example of FIG. 21, in order to simplify an explanation, a structure above the wiring layer 16 in FIG. 4 is omitted. In the example of FIG. 21, the adhesive layer 13 is eliminated.

As illustrated in FIG. 21, a metal layer 12 may have a shape obtained by combining the shapes described in the second embodiment, the third embodiment, and the first example and the second example of the fourth embodiment. That is, the metal layer 12 may have a two-layered wiring structure described in the second embodiment (FIG. 12) and the second example of the fourth embodiment (FIG. 20), and may include projections TS described in the third embodiment (FIG. 15) and the first example of the fourth embodiment (FIG. 19). Further, the metal layer 12 may be obtained by combining the shapes of the projections TS. For example, the metal layer 12 may be obtained by forming the cylindrical-shaped projections TS described in the first example of the fourth embodiment on a bottom surface of the trapezoidal-shaped projections TS described in the third embodiment.

4.4 Effect According to Present Embodiment

With the configuration according to the present embodiment, effects similar to those according to the second embodiment and the third embodiment can be obtained.

5. Fifth Embodiment

Next, a fifth embodiment will be described. In the fifth embodiment, a case where the projections TS described in the third embodiment are configured by being filled with a two-layered metal layer will be described. Hereinafter, only differences from the first embodiment to the fourth embodiment will be described.

5.1 Sectional Configuration of Memory Cell Array

Figure 22:
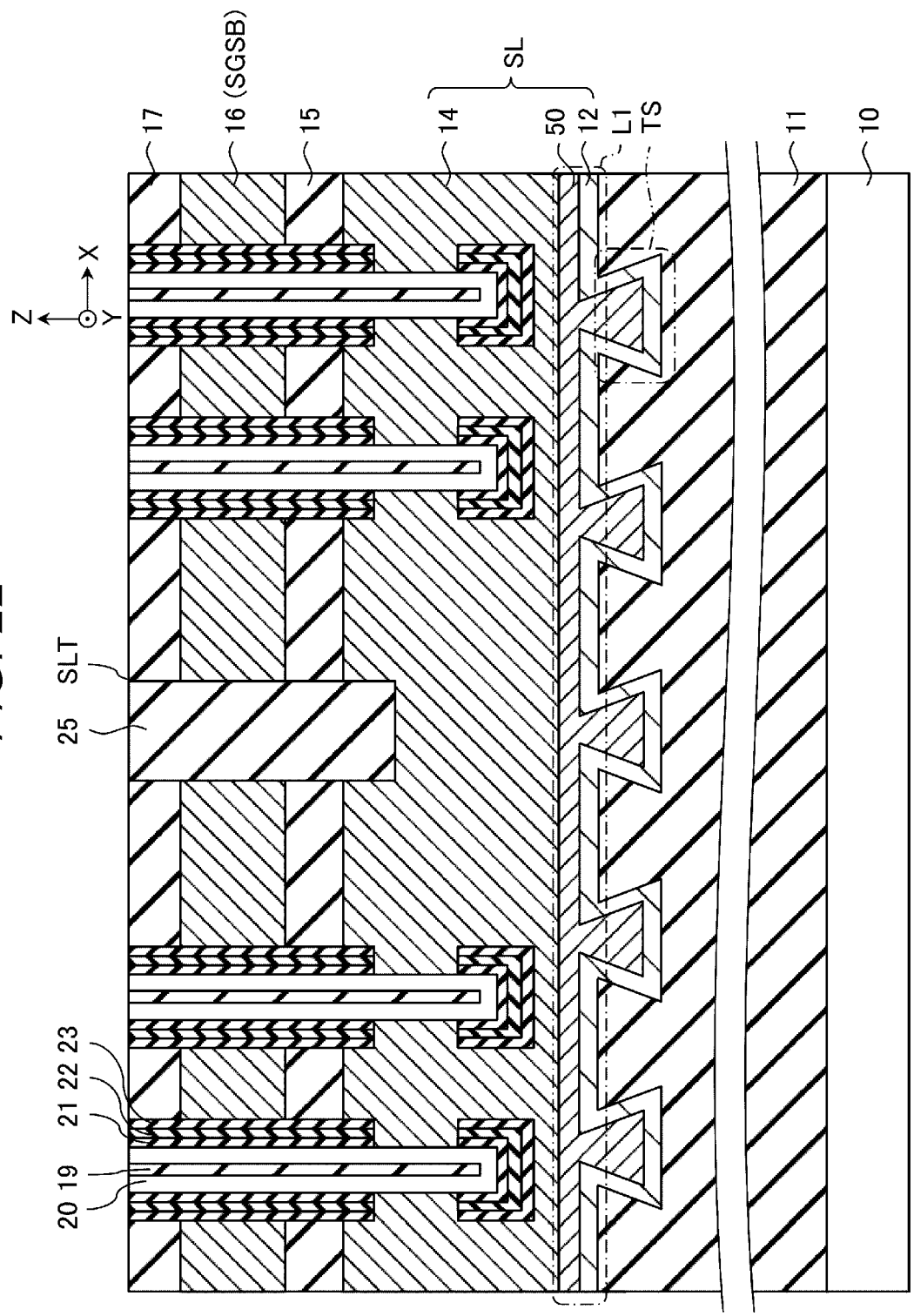
FIG. 22 is a sectional view of a memory cell array in a semiconductor memory device according to a fifth embodiment.

A sectional configuration of the memory cell array 111 will be described with reference to FIG. 22. In an example of FIG. 22, in order to simplify an explanation, a structure above the wiring layer 16 in FIG. 4 is omitted. In the example of FIG. 22, the adhesive layer 13 is eliminated.

As illustrated in FIG. 22, in the present embodiment, by reducing a film thickness of the metal layer 12 described in the third embodiment, a first wiring layer L1 and projections TS are formed in a stacked structure of a metal layer 12 and a metal layer 50. Similar to the metal layer 12, for the metal layer 50, for example, a metal material such as tungsten (W), tungsten silicide (WSi), or tungsten nitride (WN) may be used. Hereinafter, in the present embodiment, a case where WN formed by sputtering is used for the metal layer 12 and W formed by CVD is used for the metal layer 50 will be described.

5.2 Manufacturing Method of Metal Layer

Next, a manufacturing method of the metal layers 12 and 50 will be described with reference to FIG. 23.

Figure 23:
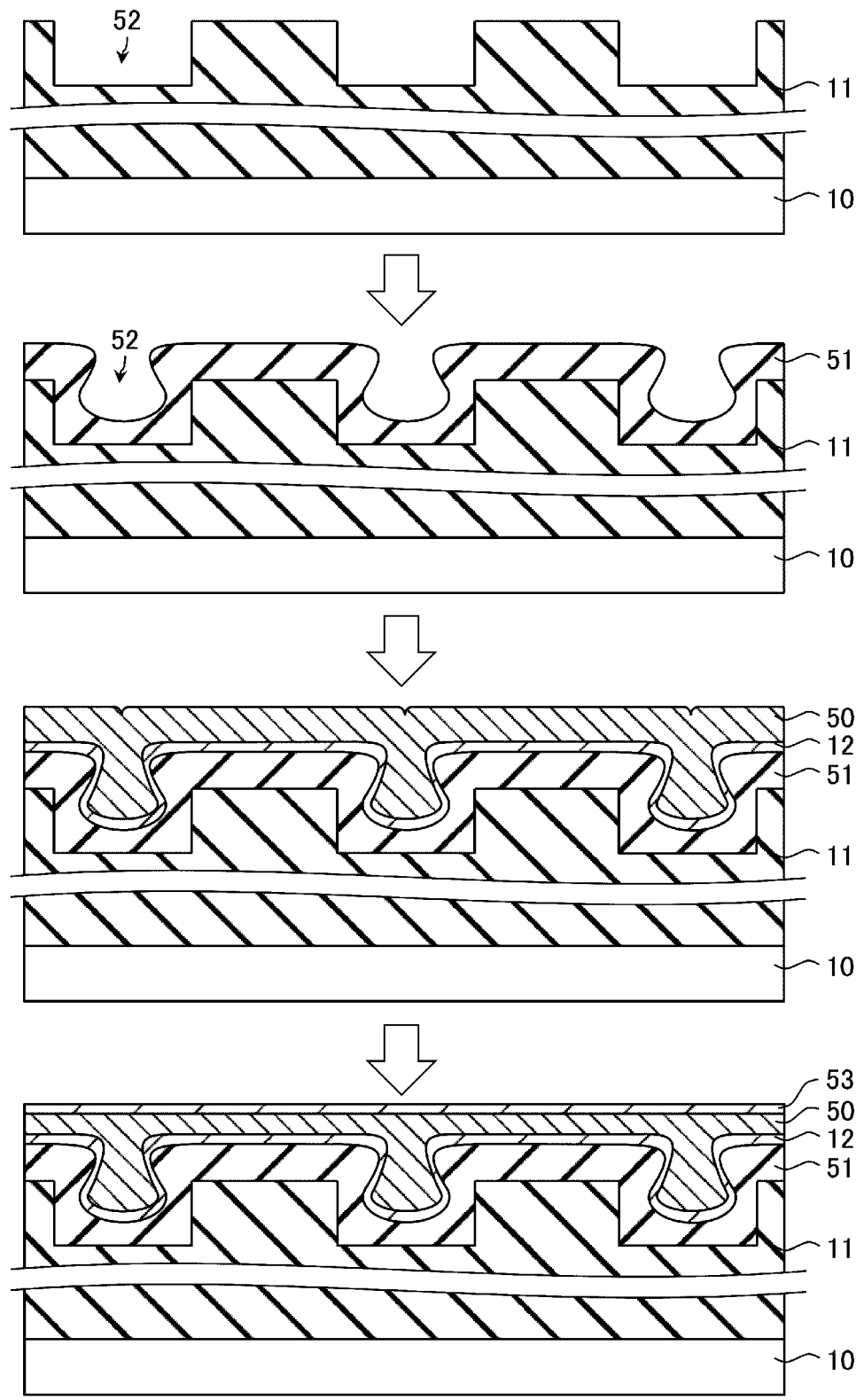
FIG. 23 is a view illustrating a manufacturing process of the memory cell array in the semiconductor memory device according to the fifth embodiment.

As illustrated in FIG. 23, an insulating layer 11 is formed on the semiconductor substrate 10, and then holes 52 (or slits 52) for forming projections TS are formed by machining the insulating layer 11.

Next, as an insulating layer 51, $SiO_2$ is formed, for example, by CVD using TEOS. At this time, eaves are formed in opening of the holes 52 according to step coverage of $SiO_2$ formed by CVD, and thus a diameter of the opening of the hole 52 is smaller than a diameter of the center portion of the hole 52 in the Z direction. Therefore, a film thickness of $SiO_2$ is set so as not to close the opening of the hole 52.

Next, a metal layer 12 of WN is formed by sputtering. A film thickness of WN is set so as not to close the hole 52. Next, as a metal layer 50, W is formed by CVD so as to fill the hole 52.

Next, planarization of a front surface of W is performed by CMP, and thus a stacked structure of WN and W is formed. A barrier layer 53 for preventing reaction with the conductive layer 14 is formed on W. For example, as the barrier layer 53, for example, a stacked film of Ti and TiN formed by sputtering is used.

Thereafter, a conductive layer 14 described in the first embodiment is formed on the barrier layer 53. The subsequent processes are the same as those in the first embodiment. An adhesive layer 13 described in the first embodiment may be formed on an upper surface of the barrier layer 53.

5.3 Effect According to Present Embodiment

With the configuration according to the present embodiment, effects similar to those according to the second embodiment to the fourth embodiment can be obtained.

6. Modification Example

The semiconductor memory device according to the above-described embodiment includes: a semiconductor substrate (10); a first insulating layer (11) formed above the semiconductor substrate; a metal layer (12) formed on the first insulating layer; an adhesive layer (13) formed on a first region of the metal layer; a conductive layer (14) formed on a second region (SST) of the metal layer and on the adhesive layer, the second region being different from the first region; a second insulating layer (15) formed on the conductive layer; a plurality of wiring layers (18) that are separated from each other and are stacked above the second insulating layer; a semiconductor layer (20) that extends in a first direction (Z direction) perpendicular to the semiconductor substrate and includes a bottom surface connected to the conductive layer; a storage portion disposed between at least one of the plurality of wiring layers and the semiconductor layer; and a slit (SLT) that extends above the second region and in the first direction, and includes a side surface in contact with the plurality of wiring layers and a bottom surface reaching the conductive layer, and is filled with an insulating material.

According to the above-described embodiment, it is possible to provide a semiconductor memory device capable of improved reliability.

The embodiments are not limited to the above-described configurations, and various modifications may be made.

For example, the embodiments may be appropriately combined with each other.

Further, the term "connection" in the embodiments also includes a state in which components are indirectly connected to each other with another component such as a transistor, a resistor, or the like interposed therebetween.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a semiconductor substrate;
   a circuit provided on the semiconductor substrate;
   a metal layer provided above the circuit, the metal layer including a first region and a second region in a first direction of the first region, the first direction being in parallel to a surface of the semiconductor substrate;
   a first layer provided on the first region of the metal layer;
   a conductive layer provided on the second region of the metal layer, the first layer being provided between the first region of the metal layer and the conductive layer, the first layer being more adhesive to the metal layer than the conductive layer is to the metal layer;
   a plurality of wiring layers that are separated from each other and are stacked above the conductive layer;

a plurality of memory pillars, each of the memory pillars extending in a second direction through the plurality of wiring layers and including a semiconductor layer, the semiconductor layer being in contact with the conductive layer, the second direction crossing the first direction and not in parallel to the surface of the semiconductor substrate, the plurality of memory pillars being provided above the first region of the metal layer and no memory pillar being provided above the second region of the metal layer.

2. The semiconductor memory device according to claim 1,
wherein a film thickness of the conductive layer on the second region in the second direction is greater than a film thickness of the conductive layer on the first region in the second direction.

3. The semiconductor device according to claim 1, wherein a film thickness of the conductive layer outside the first region in the second direction is greater than a film thickness of the conductive layer within the first region in the second direction by a film thickness of the first layer.

4. The semiconductor device according to claim 3, wherein the first layer is a silicon dioxide layer.

5. The semiconductor device according to claim 1, wherein the first layer is a silicon dioxide layer.

6. The semiconductor device according to claim 1, wherein the slit extends in the second direction above the second region.

7. The semiconductor device according to claim 6, wherein a film thickness of the conductive layer on the second region in the second direction is greater than a film thickness of the conductive layer on the first region in the second direction.

8. The semiconductor device according to claim 6, wherein the first layer is a silicon dioxide layer.

* * * * *

UNITED STATES PATENT AND TRADEMARK OFFICE
CERTIFICATE OF CORRECTION

PATENT NO. : 10,964,711 B2
APPLICATION NO. : 16/115513
DATED : March 30, 2021
INVENTOR(S) : Takeshi Murata et al.

It is certified that error appears in the above-identified patent and that said Letters Patent is hereby corrected as shown below:

On the Title Page

(57) ABSTRACT, Line 13, please replace "aside" with --a side--.

Signed and Sealed this
Seventeenth Day of May, 2022

Katherine Kelly Vidal
*Director of the United States Patent and Trademark Office*